US 9,490,268 B2

(12) United States Patent
Yamazaki et al.

(10) Patent No.: US 9,490,268 B2
(45) Date of Patent: Nov. 8, 2016

(54) SEMICONDUCTOR DEVICE AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hiroyuki Miyake, Atsugi (JP); Takahiro Sato, Tochigi (JP); Masami Jintyou, Shimotsuga (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/075,765

(22) Filed: Mar. 21, 2016

(65) Prior Publication Data

US 2016/0225796 A1 Aug. 4, 2016

Related U.S. Application Data

(63) Continuation of application No. 14/323,341, filed on Jul. 3, 2014, now Pat. No. 9,293,480.

(30) Foreign Application Priority Data

Jul. 10, 2013 (JP) .................................. 2013-144824
Aug. 1, 2013 (JP) .................................. 2013-160047

(51) Int. Cl.
*H01L 29/04* (2006.01)
*H01L 29/786* (2006.01)
*H01L 27/12* (2006.01)

(52) U.S. Cl.
CPC ......... *H01L 27/1225* (2013.01); *H01L 27/124* (2013.01); *H01L 27/1288* (2013.01); *H01L 29/7869* (2013.01)

(58) Field of Classification Search
CPC ........... H01L 27/1225; H01L 27/1288; H01L 27/124; H01L 29/7869
USPC .................. 257/43, 53, 57, 72, 88, E27.111, 257/E29.151, E29.296; 349/47, 141, 147, 349/152; 438/34, 104, 128, 149
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Coates.D et al., "Optical Studies of the Amorphous Liquid-Cholesteric Liquid Crystal Transistion: The "Blue Phase"", Physics Letters, Sep. 10, 1973, vol. 45A, No. 2, pp. 115-116.
(Continued)

*Primary Examiner* — Dao H Nguyen
(74) *Attorney, Agent, or Firm* — Robinson Intellectual Property Law Office; Eric J. Robinson

(57) ABSTRACT

A semiconductor device including a transistor and a connection portion is provided. The transistor includes a gate electrode, a first insulating film over the gate electrode, an oxide semiconductor film over the first insulating film and at a position overlapping with the gate electrode, and source and drain electrodes electrically connected to the oxide semiconductor film; and the connection portion includes a first wiring on the same surface as a surface on which the gate electrode is formed, a second wiring on the same surface as a surface on which the source and drain electrodes are formed, and a third wiring connecting the first wiring and the second wiring. The distance between an upper end portion and a lower end portion of the second wiring is longer than the distance between an upper end portion and a lower end portion of each of the source and drain electrodes.

15 Claims, 20 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,933,568 B2 | 8/2005 | Yang et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,202,500 B2 * | 4/2007 | Yoo | H01L 27/1248 257/59 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,751,011 B2 * | 7/2010 | Ahn | G02F 1/1362 349/122 |
| 7,791,072 B2 | 9/2010 | Kumomi et al. | |
| 7,902,549 B2 | 3/2011 | Yang et al. | |
| 8,102,476 B2 * | 1/2012 | Son | G02F 1/136213 349/14 |
| 8,294,147 B2 | 10/2012 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0197181 A1 * | 10/2003 | Yun | H01L 27/124 257/72 |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0298988 A1 | 11/2012 | Hara et al. | |
| 2013/0240873 A1 | 9/2013 | Yamazaki et al. | |
| 2014/0034949 A1 | 2/2014 | Matsukura | |
| 2014/0209897 A1 * | 7/2014 | Kubota | H01L 29/41733 257/43 |
| 2014/0306217 A1 | 10/2014 | Yamazaki et al. | |
| 2014/0339538 A1 | 11/2014 | Yamazaki et al. | |
| 2014/0339539 A1 | 11/2014 | Yamazaki et al. | |
| 2014/0339548 A1 | 11/2014 | Yamazaki et al. | |
| 2014/0340608 A1 | 11/2014 | Yamazaki et al. | |
| 2014/0361290 A1 | 12/2014 | Yamazaki et al. | |
| 2014/0361292 A1 | 12/2014 | Yamazaki et al. | |
| 2014/0362324 A1 | 12/2014 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM—05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with instrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

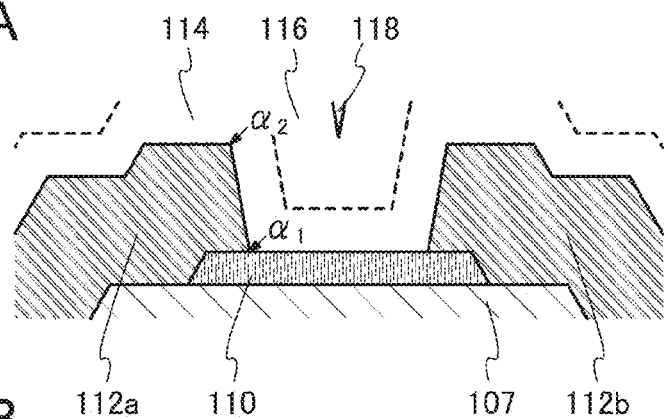
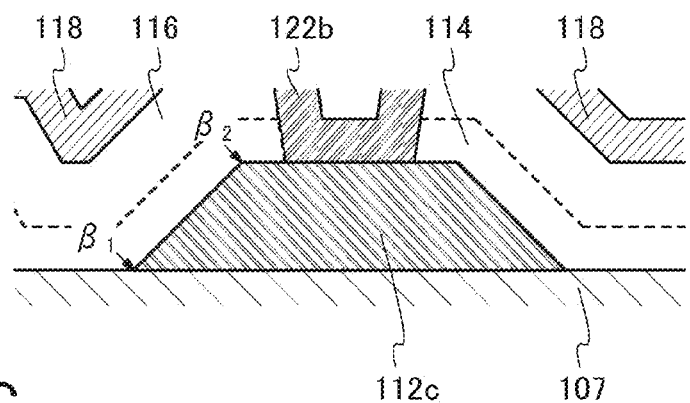
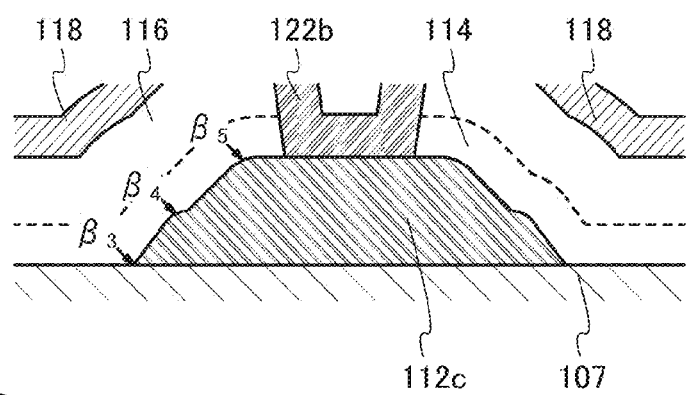
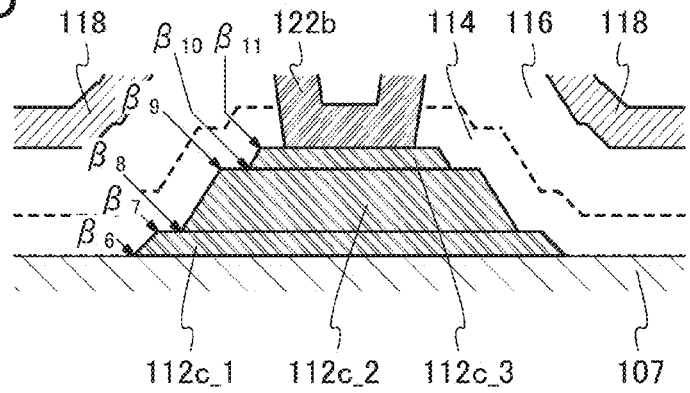

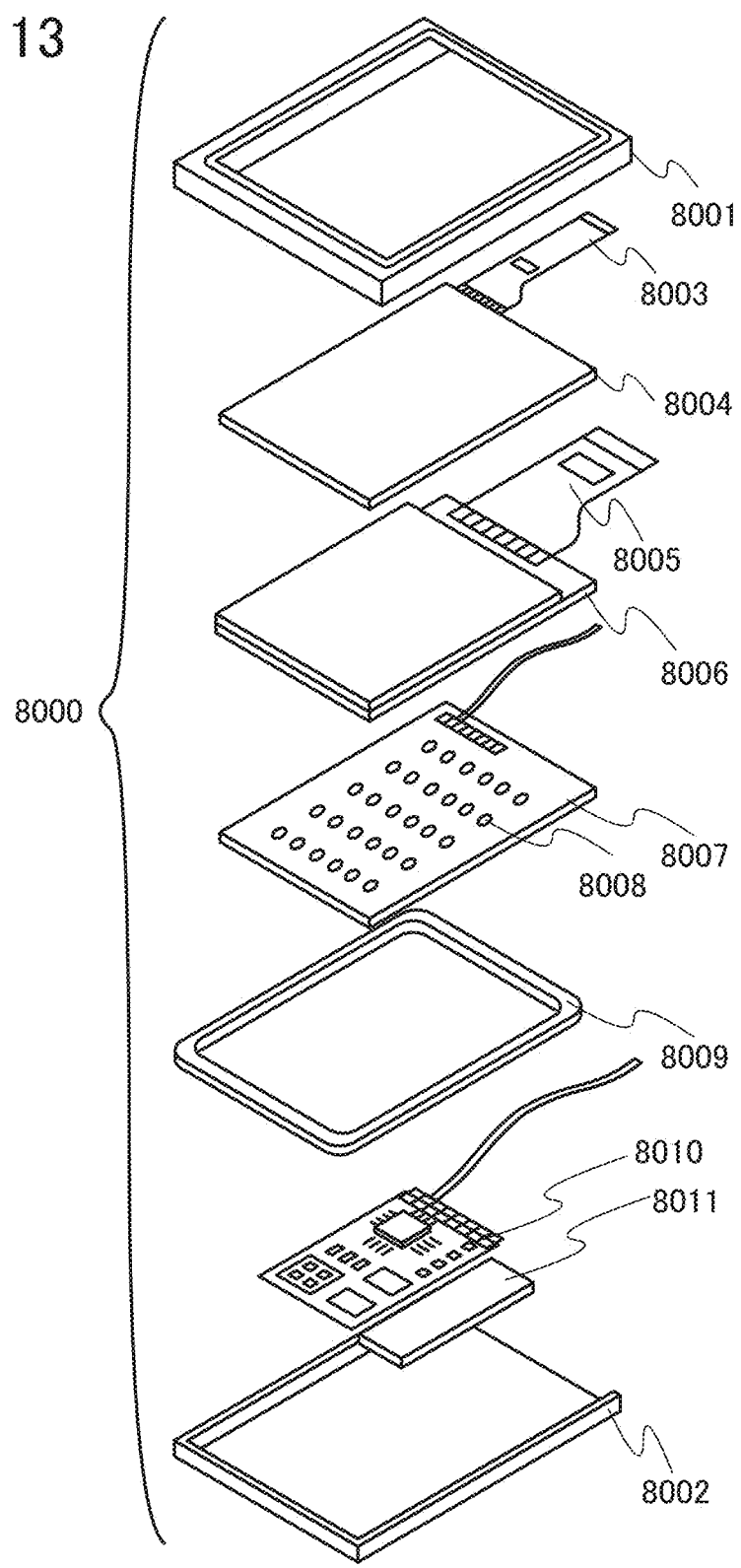

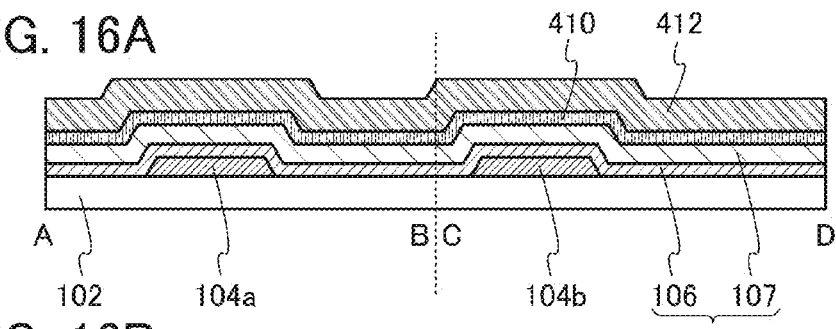
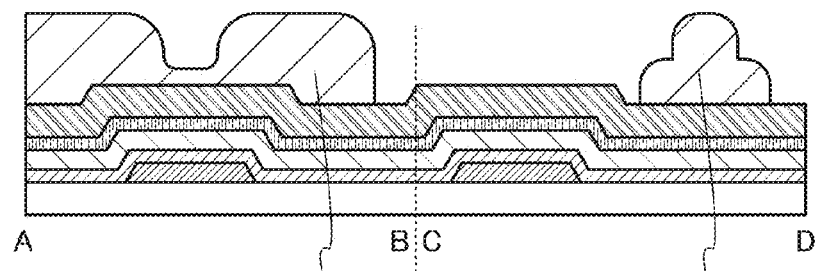
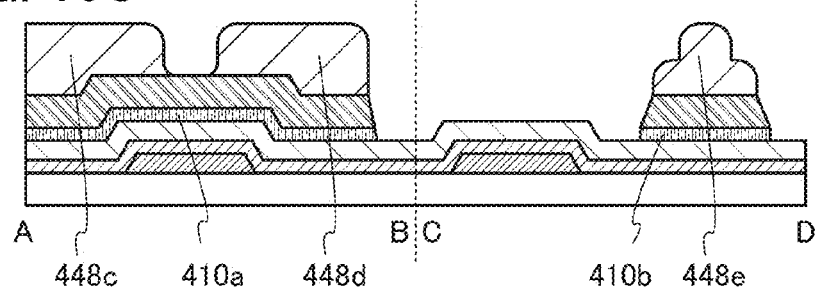
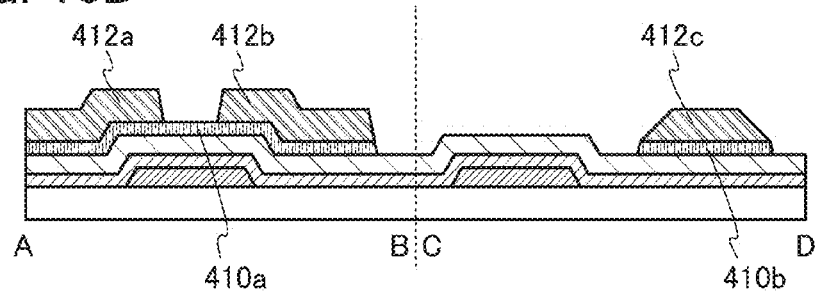
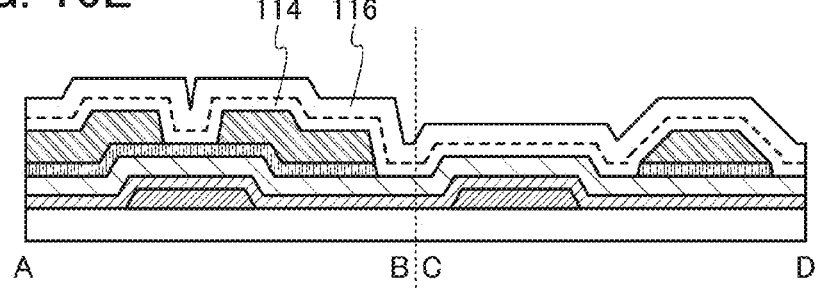

SEMICONDUCTOR DEVICE AND DISPLAY DEVICE INCLUDING THE SEMICONDUCTOR DEVICE

BACKGROUND OF THE INVENTION

1. Field of the Invention

The present invention relates to a semiconductor device including a transistor including an oxide semiconductor film. Furthermore, the present invention relates to a display device including the semiconductor device.

2. Description of the Related Art

Attention has been focused on a technique for forming a transistor using a semiconductor thin film formed over a substrate (also referred to as a thin film transistor (TFT)). Such a transistor is used in a wide range of electronic devices such as an integrated circuit (IC) or an image display device (display device). A silicon-based semiconductor material is widely known as a material for a semiconductor thin film applicable to a transistor. As another material, an oxide semiconductor has attracted attention.

For example, a transistor including an oxide semiconductor containing indium (In), gallium (Ga), and zinc (Zn) as an active layer of the transistor has been disclosed (see Patent Document 1 and Patent Document 2).

In recent years, with increased performance and reductions in the size and weight of electronic appliances, demand for a display device in which a driver circuit is formed no that miniaturized transistors, connection wirings, or the like are integrated with high density, and the driver circuit and the display device are provided on the same substrate has risen.

REFERENCE

Patent Document

[Patent Document 1] Japanese Published Patent Application No. 2006-165528
[Patent Document 2] Japanese Published Patent Application No. 2007-096055

SUMMARY OF THE INVENTION

In a semiconductor device including an oxide semiconductor film, when transistors and wirings such as a power supply line and a signal line electrically connected to the transistors are integrated with high density, defects are generated in a connection portion between the wirings in some cases.

For example, in the case where the distance between the wirings is narrow, the case where the wiring has a large unevenness of a step, or the like, normal conduction cannot be ensured in the connection portion due to disconnection of a conductive film that connects the wirings or poor coverage of the conductive film that connects the wirings. In the case where a semiconductor device including such a connection portion is used in a display device, for example, a decrease in the yield of the display device occurs because of malfunction of the connection portion.

In view of the above problem, an object of one embodiment of the present invention is to provide a semiconductor device including a transistor and a connection portion each of which has excellent electrical characteristics because of having wirings with specific shapes.

Another object of one embodiment of the present invention is to give favorable electrical characteristics to a semiconductor device including an oxide semiconductor. Another object is to provide a highly reliable semiconductor device which includes an oxide semiconductor and in which a change in the electrical characteristics is suppressed. Another object of one embodiment of the present invention is to provide a semiconductor device that is suitable for miniaturization. Another object of one embodiment of the present invention is to provide a semiconductor device with high productivity.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a transistor and a connection portion. The transistor includes agate electrode, a first insulating film over the gate electrode, an oxide semiconductor film over the first insulating film and at a position overlapping with the gate electrode, and a source electrode and a drain electrode electrically connected to the oxide semiconductor film. The connection portion includes a first wiring on the same surface as a surface on which the gate electrode is formed, a second wiring on the same surface as a surface on which the source electrode and the drain electrode are formed, and a third wiring connecting the first wiring and the second wiring. A distance between an upper end portion and a lower end portion of the second wiring is longer than a distance between an upper end portion and a lower end portion of each of the source electrode and the drain electrode.

The distance between the upper end portion and the lower end portion of the second wiring is longer than that of each of the source electrode and the drain electrode, whereby a step difference due to the second wiring can be reduced. By reducing the step difference due to the second wiring, the coverage with the insulating films and/or the conductive film, which are formed over the second wiring, can be improved. Thus, a connection portion with excellent electrical characteristics, in other words, with reduced conduction failures can be obtained.

The distance between the upper end portion and the lower end portion of each of the source electrode and the drain electrode included in the transistor is shorter than that of the second wiring. Such a structure enables the transistor to have favorable electrical characteristics. For example, in the case where the transistor is a channel-etched transistor, at the time of formation of the source electrode and the drain electrode, the oxide semiconductor film, which is a semiconductor layer, might be damaged. However, the source electrode and the drain electrode each have the above structure, whereby damage to the oxide semiconductor film can be minimized. Furthermore, the end portion of each of the source electrode and the drain electrode has the above structure, whereby the electric field can be favorably applied to the oxide semiconductor film serving as a channel region.

Another embodiment of the present invention is a semiconductor device including a transistor and a connection portion. The transistor includes a gate electrode, a first insulating film over the gate electrode, an oxide semiconductor film over the first insulating film and at a position overlapping with the gate electrode, and a source electrode and a drain electrode electrically connected to the oxide semiconductor film. The connection portion includes a first wiring on the same surface as a surface on which the gate electrode is formed, the first insulating film over the first wiring, a first opening in the first insulating film, a second wiring on the same surface as a surface on which the source electrode and the drain electrode are formed, a second insulating film over the second wiring, a second opening in the second insulating film, and a third wiring covering the first opening and the second opening and connecting the first wiring and the second wiring. A distance between an upper end portion and a lower end portion of the second wiring is longer than a distance between an upper end portion and a lower end portion of each of the source electrode and the drain electrode.

According to one embodiment of the present invention, a semiconductor device including a transistor having excellent electrical characteristics and a connection portion having excellent electrical characteristics can be provided.

BRIEF DESCRIPTION OF THE DRAWINGS

In the accompanying drawings:

FIGS. 2A to 2D are cross-sectional views each illustrating one embodiment of a semiconductor device;

FIG. 13 illustrates a display module;

FIGS. 16A to 16E are cross-sectional views illustrating one embodiment of a method for manufacturing a semiconductor device;

DETAILED DESCRIPTION OF INVENTION

Figure 1A:
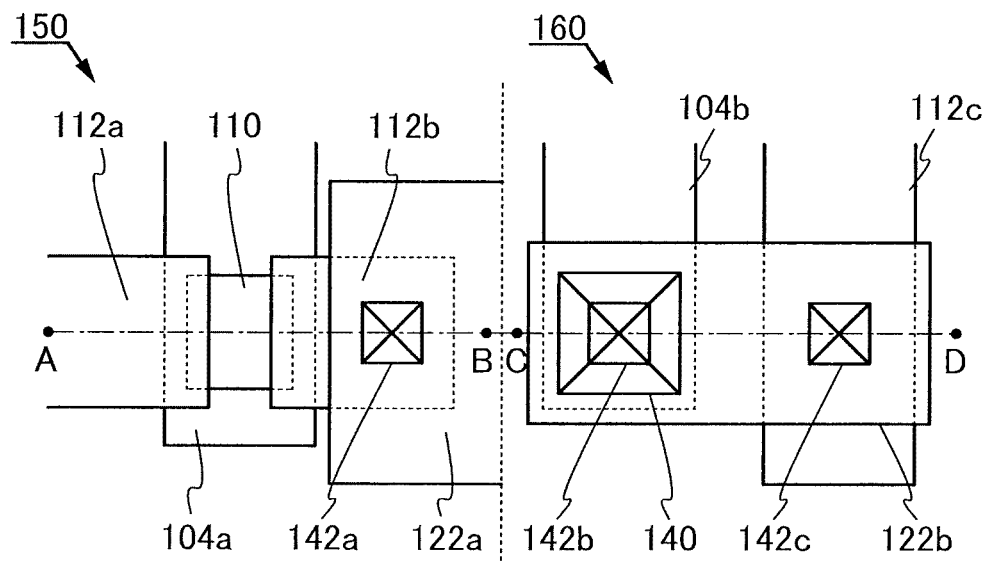
FIGS. 1A and 1B are a top view and a cross-sectional view illustrating one embodiment of a semiconductor device.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

In this specification, in the case where an etching step is performed after a photolithography process, a mask formed in the photolithography process is removed.

(Embodiment 1)

In this embodiment, a semiconductor device of one embodiment of the present invention is described with reference to FIGS. 1A and 1B, FIGS. 2A to 2D, and FIGS. 3A to 3C.

<Structural Example of Semiconductor Device>

Figure 1B:
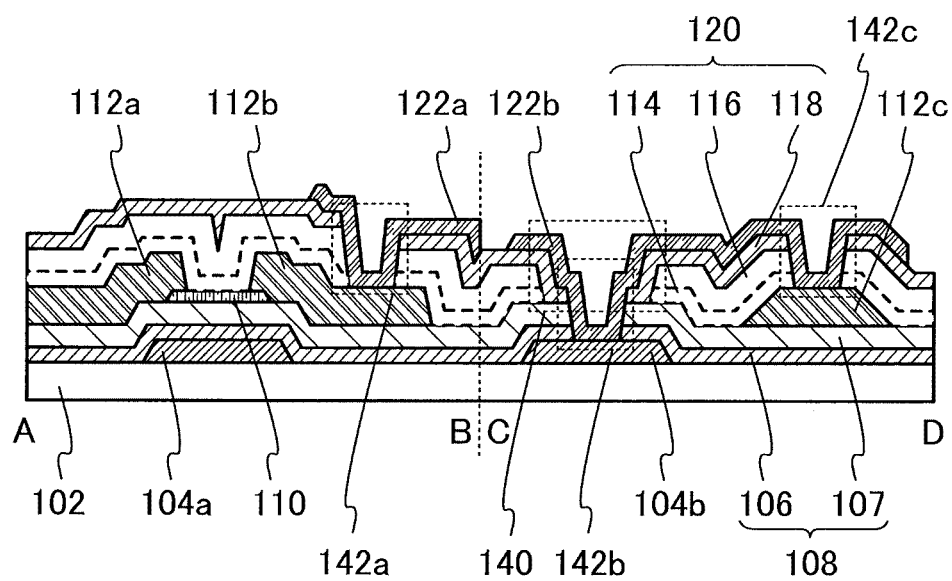

FIG. 1A is a top view of the semiconductor device of one embodiment of the present invention, and FIG. 1B is a cross-sectional view taken along a dashed-dotted line A-B and a dashed-dotted line C-D shown in FIG. 1A. Note that in FIG. 1A, some components of the semiconductor device (e.g., an insulating film serving as a gate insulating film) are not illustrated to avoid complexity.

The semiconductor device in FIGS. 1A and 1B includes a transistor 150 and a connection portion 160.

The transistor 150 includes a gate electrode 104a over a substrate 102, a first insulating film 108 formed over the gate electrode 104a, an oxide semiconductor film 110 formed in a position over the first insulating film 108 and overlapping with the gate electrode 104a, and a source electrode 112a and a drain electrode 112b that are electrically connected to the oxide semiconductor film 110.

FIG. 1B illustrates an example in which the first insulating film 108 has a two-layer structure of an insulating film 106 and an insulating film 107. Note that the structure of the first insulating film 108 is not limited thereto, and for example, the first insulating film 108 may have a single-layer structure or a stacked-layer structure including three or more layers.

In addition, over the transistor 150, specifically over the oxide semiconductor film 110, the source electrode 112a, and the drain electrode 112b, a second insulating film 120 is formed. FIG. 1B illustrates an example in which the second insulating film 120 has a three-layer structure of insulating films 114, 116, and 118. Note that the structure of the second insulating film 120 is not limited thereto, and for example, the second insulating film 120 may have a single-layer structure or a stacked-layer structure including two layers or four or more layers.

Moreover, an opening 142a reaching the drain electrode 112b is formed in the second insulating film 120. In addition, a conductive film 122a serving as a pixel electrode is formed over the second insulating film 120 to cover the opening 142a. The conductive film 122a is connected to the drain electrode 112b of the transistor 150.

The connection portion 160 includes a first wiring 104b over the substrate 102, the first insulating film 108 over the first wiring 104b, an opening 142b provided in the first insulating film 108, a second wiring 112c over the first insulating film 108, the second insulating film 120 over the second wiring 112c, an opening 140 provided in the second insulating film 120, and a conductive film 122b serving as a third wiring that is formed to cover the openings 142b and 140 and connects the first wiring 104b and the second wiring 112c. FIG. 1B shows an example in which an opening over the first wiring 104b has two-level shapes of the opening 140 and the opening 142b, however, the opening shape is not limited thereto. For example, an opening reaching the first wiring 104b may be formed in one step of forming the opening 142b.

Note that the first wiring 104b is formed in the same steps as the gate electrode 104a of the transistor 150. In other words, the first wiring 104b and the gate electrode 104a of the transistor 150 are formed on the same surface. Moreover, the second wiring 112c is formed in the same steps as the source electrode 112a and the drain electrode 112b of the transistor 150. In other words, the second wiring 112c and the source electrode 112a and the drain electrode 112b of the transistor 150 are formed on the same surface.

Here, FIGS. 2A and 2B each illustrate a partly enlarged view of the transistor 150 and the connection portion 160 of the semiconductor device in FIG. 1B. FIG. 2A is a partly enlarged view of the source electrode 112a and the drain electrode 112b of the transistor 150, and FIG. 2B is a partly enlarged view of the second wiring 112c of the connection portion 160.

As illustrated in FIG. 2A, end portions of the source electrode 112a and the drain electrode 112b of the transistor 150 each have a lower end portion $\alpha_1$ and an upper end portion $\alpha_2$, in FIG. 2A, the lower end portion $\alpha_1$ and the upper end portion $\alpha_2$ are shown only on the source electrode 112a side; however, the drain electrode 112b also has a structure similar to that of the source electrode 112a.

Furthermore, as illustrated in FIG. 2B, end portions of the second wiring 112c of the connection portion 160 has a lower end portion $\beta_1$ and an upper end portion $\beta_2$. In FIG. 2B, the lower end portion $\beta_1$ and the upper end portion $\beta_2$ are shown only on one end portion of the second wiring 112c; however, the other end portion of the second wiring 112c also has a structure similar to that of the one end portion of the second wiring 112c. However, the shape of the end portions of the second wiring 112c is not limited to the structure in FIG. 2B, and for example, only one end portion of the second wiring 112c may have a structure similar to that in FIG. 2B.

As illustrated in FIGS. 2A and 2B, the distance between the upper end portion and the lower end portion of the end portion of the second wiring 112c (the distance between $\beta_1$ and $\beta_2$) included in the connection portion 160 is longer than the distance between the upper end portion and the lower end portion of each end portion of the source electrode 112a and the drain electrode 112b (the distance between $\alpha_1$ and $\alpha_2$) included in the transistor 150.

The distance between the upper end portion and the lower end portion of the second wiring 112c is made longer than that of each of the source electrode 112a and the drain electrode 112b, whereby a step difference due to the second wiring 112c can be reduced. By reducing the step difference due to the second wiring 112c, the coverage with the insulating films 114, 116, 118 and/or the conductive film 122b serving as the third wiring, which are formed over the second wiring 112c, can be improved. Thus, contact failures between the second wiring 112c and the conductive film 122b serving as the third wiring can be reduced.

The distance between the upper end portion and the lower end portion of each of the source electrode 112a and the drain electrode 112b included in the transistor 150 is shorter than that of the second wiring 112c. Such a structure enables the transistor to have favorable electrical characteristics. In the case where the transistor 150 is a channel-etched transistor as illustrated in FIG. 1B and FIG. 2A, damage to the oxide semiconductor film 110 may be caused at the time of formation of the source electrode 112a and the drain electrode 112b.

For example, at the time of formation of the source electrode 112a, the drain electrode 112b, and the second wiring 112c, by adjusting the etching condition, the shape of each end portion of the source electrode 112a, the drain electrode 112b, and the second wiring 112c can be adjusted, and the shapes of the source electrode 112a and the drain electrode 112b are adjusted to the shapes similar to those of the second wiring 112c, whereby the etching time gets longer and damage to the oxide semiconductor film 110 is easily caused. Thus, the transistor 150 including the damaged oxide semiconductor film 110 does not have stable electrical characteristics in some cases. Furthermore, the channel length (L) of the transistor 150 is determined by the distance between the source electrode 112a and the drain electrode 112b; thus, by adjusting the shapes of the end portions of the source electrode 112a and the drain electrode 112b, the channel lengths (L) of the transistors on a substrate varies in some cases.

However, in the semiconductor device of one embodiment of the present invention, the shapes of end portions of the source electrode and the drain electrode included in the transistor are different from those of the wiring included in the connection portion, whereby both stable electrical characteristics of the transistor and excellent contact resistance of the connection portion can be obtained. This is an advantageous effect obtained by using the semiconductor device of one embodiment of the present invention.

Furthermore, in the semiconductor device of one embodiment of the present invention, the source electrode and the drain electrode of the transistor and the wiring of the connection portion can be collectively formed using the same mask. Thus, a semiconductor device with high productivity can be provided.

Here, modification examples of the connection portion 160 in FIG. 2B are described with reference to FIGS. 2C and 2D.

FIG. 2C shows a modification example of the connection portion in FIG. 2B, and the shape of the end portion of the second wiring 112c is different. In accordance with the shape difference of the end portion of the second wiring 112c, the shapes of the insulating films 114, 116, and 118 formed thereover are also different.

The end portion of the connection portion 160 in FIG. 2C includes a middle end portion $\beta_4$ between a lower end portion $\beta_3$ and an upper end portion $\beta_5$. Thus, the end portion of the second wiring 112c may have a stepwise shape including plural angles. Thus, the coverage with the insulating films 114, 116, and 118 formed over the second wiring 112c can be further improved.

Furthermore, in the end portion of the connection portion 160 in FIG. 2C, the middle end portion $\beta_4$ and the upper end portion $\beta_5$ each have a curvature. With such a structure in which the end portions each have a curvature, the coverage with the insulating films 114, 116, and 118 formed over the second wiring 112c can be further improved.

FIG. 2D shows a modification example of the connection portion in FIG. 2B, and the shape of the end portion of the second wiring 112c is different. In accordance with the shape difference of the end portion of the second wiring 112c, the shapes of the insulating films 114, 116, and 118 formed thereover are also different.

The end portion of the connection portion 160 in FIG. 2D includes middle end portions $\beta_7$, $\beta_8$, $\beta_9$, and $\beta_{10}$ between a lower end portion $\beta_6$ and an upper end portion $\beta_{11}$. For example, as illustrated in FIG. 2D, the second wiring 112c has a three-layer structure of a second wiring 112c_1, a second wiring 112c_2, and a second wiring 112c_3, whereby the second wiring 112c can include the middle end portions $\beta_7$, $\beta_8$, $\beta_9$, and $\beta_{10}$ between the lower end portion $\beta_6$ and the upper end portion $\beta_{11}$. In this manner, the second wiring 112c preferably has a stacked-layer structure of at least two layers.

As illustrated in FIGS. 2A to 2D, in the semiconductor device of one embodiment of the present invention, at least the distance between the upper end portion and the lower end portion of the second wiring 112c (the distance between $\beta_1$ and $\beta_2$, the distance between $\beta_3$ and $\beta_5$, or the distance between $\beta_6$ and $\beta_{11}$) included in the connection portion 160 is preferably longer than the distance between the upper end portion and the lower end portion of each of the source electrode 112a and the drain electrode 112b (the distance between $\alpha_1$ and $\alpha_2$) included in the transistor 150.

As illustrated in FIGS. 2A to 2D, it is necessary that the upper end portion be provided inside the lower end portion in each of the source electrode 112a, the drain electrode 112b, and the second wiring 112c.

<Top Surface Shape of Connection Portion (Modification Example)>

Modification examples of the top surface shape of the connection portion 160 in FIG. 1A are described with reference to FIGS. 3A to 3C.

Figure 3A:
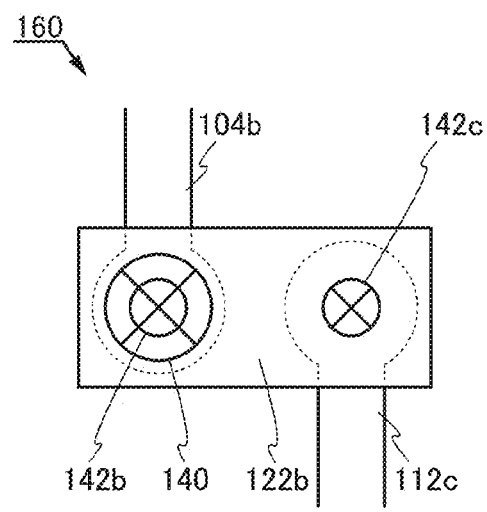
FIGS. 3A to 3C are top views each illustrating one embodiment of a semiconductor device.

In FIG. 3A, the first wiring 104b is connected to the second wiring 112c through the conductive film 122b serving as the third wiring.

As illustrated in FIG. 3A, top surfaces of tips of the first wiring 104b and the second wiring 112c each may have a circular shape. Although not illustrated, the top surface may have a shape in which an elliptical or polygonal shape and a straight line are combined other than a circular shape.

The top surface of the tip of each of the first wiring 104b and the second wiring 112c has a circular shape as illustrated in FIG. 3A, whereby particles generated in the manufacturing process of the semiconductor device can be prevented from being accumulated in the end portion. Thus, the second wiring 112c serving as the third wiring can favorably cover the openings 140, 142b, and 142c.

Figure 3B:
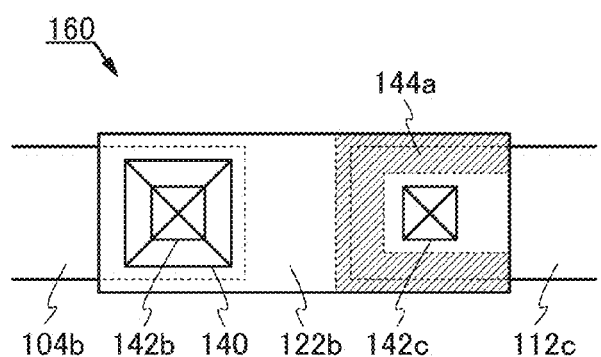

In FIGS. 1A and 3A, the first wiring 104b and the second wiring 112c are extended parallel to each other; however, the first wiring 104b and the second wiring 112c may be arranged to face each other as illustrated in FIG. 3B. Furthermore, as illustrated in FIG. 3C, the first wiring 104b and the second wiring 112c may be arranged to be at right angles to each other. The top surfaces and the arrangement method of the first wiring 104b and the second wiring 112c may be selected as appropriate by a practitioner, as illustrated in FIGS. 3A to 3C.

Figure 3C:
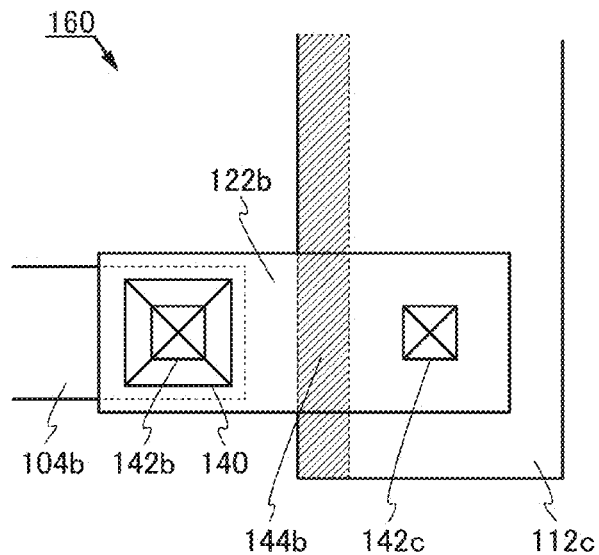

In FIGS. 3B and 3C, a region 144a and a region 144b are provided above the second wiring 112c, respectively.

The regions 144a and 144b FIGS. 3B and 3C are regions where the distance between the upper end portion and the lower end portion in part of the end portion of the second wiring 112c is longer than the distance between the upper end portion and the lower end portion of each of the source electrode 112a and the drain electrode 112b included in the transistor 150. For example, at the time of formation of the second wiring 112c, by a photolithography process, the second wiring 112c is processed with the use of a light-exposure mask such as a gray-tone mask; whereby part of the shape of the end portion of the second wiring 112c can have any of the structures in FIG. 1B and FIGS. 2B to 2D.

Note that the detail of the semiconductor device of one embodiment of the present invention in FIGS. 1A and 1B is described in a method for manufacturing the semiconductor device.

<Method for Manufacturing Semiconductor Device>

A method for manufacturing the semiconductor device of one embodiment of the present invention illustrated in FIGS. 1A and 1B is described in detail with reference to FIGS. 4A to 4D, FIGS. 5A to 5D, and FIGS. 6A and 6B.

First, the substrate 102 is prepared. For the substrate 102, a glass material such as aluminosilicate glass, aluminoborosilicate glass, or barium borosilicate glass is used. In the mass production, a mother glass with the following size is preferably used for the substrate 102: the 8-th generation (2160 mm×2460 mm); the 9-th generation (2400 mm×2800 mm, or 2450 mm×3050 mm); the 10-th generation (2950 mm×3400 mm); or the like. High process temperature and a long period of process time drastically shrink the mother glass. Thus, in the case where mass production is performed with the use of the mother glass, it is preferable that the heat process in the manufacturing process be preferably performed at a temperature lower than or equal to 600° C., further preferably lower than or equal to 450° C., still further preferably lower than or equal to 350° C.

Next, a conductive film is formed over the substrate 102 and processed into desired regions, whereby the gate electrode 104a and the first wiring 104b are formed. After that, the first insulating film 108 including the insulating films 106 and 107 is formed over the substrate 102, the gate electrode 104a, and the first wiring 104b (see FIG. 4A).

The step of forming the gate electrode 104a and the first wiring 104b is referred to as a first patterning step.

As a material used for the gate electrode 104a and the first wiring 104b, a metal element selected from aluminum, chromium, copper, tantalum, titanium, molybdenum, and tungsten, an alloy containing any of these metal elements as a component, an alloy containing these metal elements in combination, or the like can be used. The material used for the gate electrode 104a and the first wiring 104b may have a single-layer structure or a stacked-layer structure of two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used. The material used for the gate electrode 104a and the first wiring 104b can be formed by a sputtering method, for example.

The insulating film 106 is formed with a single-layer structure or a stacked-layer structure using, for example, any of a silicon nitride oxide film, a silicon nitride film, an aluminum oxide film, and the like with a PE-CVD apparatus. In the case where the insulating film 106 has a stacked-layer structure, it is preferable that a silicon nitride film with fewer defects be provided as a first silicon nitride film, and a silicon nitride film from which hydrogen and ammonia are less likely to be released be provided over the first silicon nitride film, as a second silicon nitride film. As a result, hydrogen and nitrogen contained in the insulating film 106 can be inhibited from moving or diffusing into the oxide semiconductor film 110 to be formed later.

The insulating film 107 is formed with a single-layer structure or a stacked-layer structure using any of a silicon oxide film, a silicon oxynitride film, and the like with a PE-CVD apparatus.

The first insulating film 108 can have a stacked-layer structure, for example, in which a 400-nm-thick silicon nitride film used as the insulating film 106 and a 50-nm-thick silicon oxynitride film used as the insulating film 107 are formed in this order. The silicon nitride film and the silicon oxynitride film are preferably formed in succession in a vacuum, in which case entry of impurities is suppressed. The first insulating film 108 in a position overlapping with the gate electrode 104a serves as a gate insulating film of the transistor 150. Note that silicon nitride oxide refers to an insulating material that contains more nitrogen than oxygen, whereas silicon oxynitride refers to an insulating material that contains more oxygen than nitrogen.

When the gate insulating film has the above structure, the following effects can be obtained, for example. The silicon nitride film has a higher relative permittivity than a silicon oxide film and needs a larger thickness for an equivalent capacitance. Thus, the physical thickness of the gate insulating film can be increased. This makes it possible to inhibit a decrease in the withstand voltage of the transistor 150 and furthermore increase the withstand voltage, thereby inhibiting electrostatic breakdown of the transistor 150.

Figure 4A:
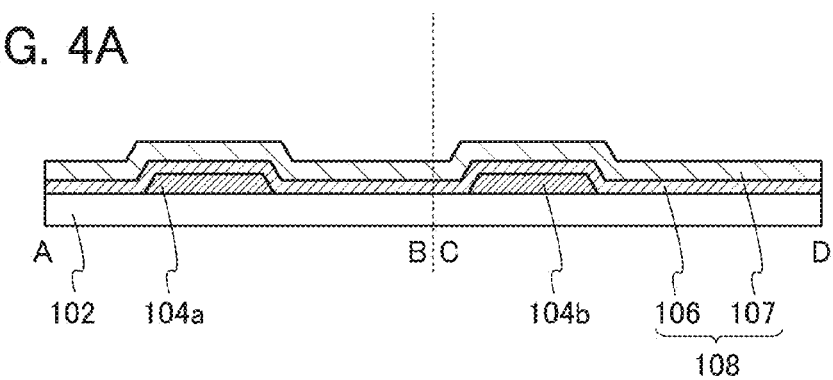
FIGS. 4A to 4D are cross-sectional views illustrating one embodiment of a method for manufacturing a semiconductor device.
Figure 4B:
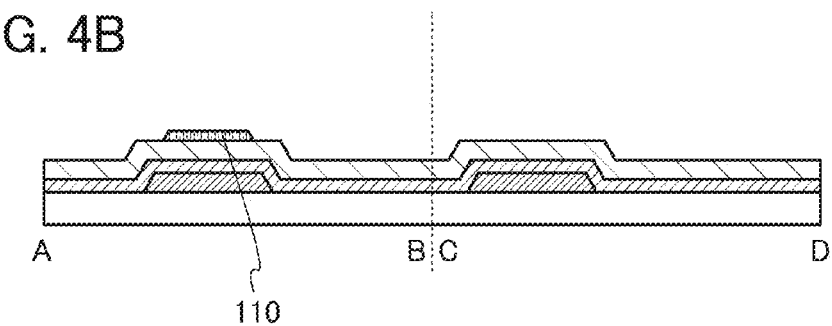

Next, an oxide semiconductor film is formed over the first insulating film 108 and processed into a desired region, whereby the oxide semiconductor film 110 is formed (see FIG. 4B).

The step of forming the oxide semiconductor film 110 is referred to as a second patterning step.

The oxide semiconductor film 110 preferably includes a film represented by an In-M-Zn oxide that contains at least indium (In), zinc (Zn), and M (M is a metal such as Al, Ga, Ge, Y, Zr, Sn, La, Ce, or Hf). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf, aluminum (Al), zirconium (Zr), and the like can be given. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given.

As the oxide semiconductor included in the oxide semiconductor film 110, any of the following can be used: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that the In—Ga—Zn-based oxide refers to an oxide containing In, Ga, and Zn as its main components and there is no particular limitation on the ratio of In, Ga, and Zn. The In—Ga—Zn-based oxide may contain a metal element other than the In, Ga, and Zn.

The oxide semiconductor film 110 can be formed by a sputtering method, a molecular beam epitaxy (MBE) method, a CVD method, a pulse laser deposition method, an atomic layer deposition (ALD) method, or the like as appropriate. In particular, the oxide semiconductor film 110 is preferably formed by the sputtering method because the oxide semiconductor film 110 can be dense.

In the formation of an oxide semiconductor film as the oxide semiconductor film 110, the hydrogen concentration in the oxide semiconductor film is preferably reduced as much as possible. To reduce the hydrogen concentration, for example, in the case of a sputtering method, a deposition chamber needs to be evacuated to a high vacuum and also a sputtering gas needs to be highly purified. As an oxygen gas or an argon gas used for a sputtering gas, a gas which is highly purified to have a dew point of −40° C., or lower, preferably −80° C. or lower, further preferably −100° C. or lower, or still further preferably −120° C. or lower is used, whereby entry of moisture or the like into the oxide semiconductor film can be minimized.

In order to remove moisture remaining in the deposition chamber, an entrapment vacuum pump such as a cryopump, an ion pump, or a titanium sublimation pump is preferably used. A turbo molecular pump provided with a cold trap may be alternatively used. When the deposition chamber is evacuated with a cryopump, which has a high capability in removing a hydrogen molecule, a compound including a hydrogen atom such as water ($H_2O$), a compound including a carbon atom, and the like, the concentration of an impurity to be contained in a film formed in the deposition chamber can be reduced.

When the oxide semiconductor film as the oxide semiconductor film 110 is formed by a sputtering method, the relative density (filling factor) of a metal oxide target that is used for the film formation is greater than or equal to 90% and less than or equal to 100%, preferably greater than or equal to 95% and less than or equal to 100%. With the use of the metal oxide target having high relative density, a dense oxide semiconductor film can be formed.

Note that to reduce the impurity concentration of the oxide semiconductor film, it is also effective to form the oxide semiconductor film as the oxide semiconductor film 110 while the substrate 102 is kept at high temperature. The temperature at which the substrate 102 is heated may be higher than or equal to 150° C. and lower than or equal to 450° C.; the substrate temperature is preferably higher than or equal to 200° C. and lower than or equal to 350° C.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate for desorbed oxygen. By the first heat treatment, the crystallinity of the oxide semiconductor that is used as the oxide semiconductor film 110 can be improved, and in addition, impurities such as hydrogen and water can be removed from the first insulating film 108 and the oxide semiconductor film 110. The first heat treatment may be performed before processing into the oxide semiconductor film 110 having an island shape.

Figure 4C:
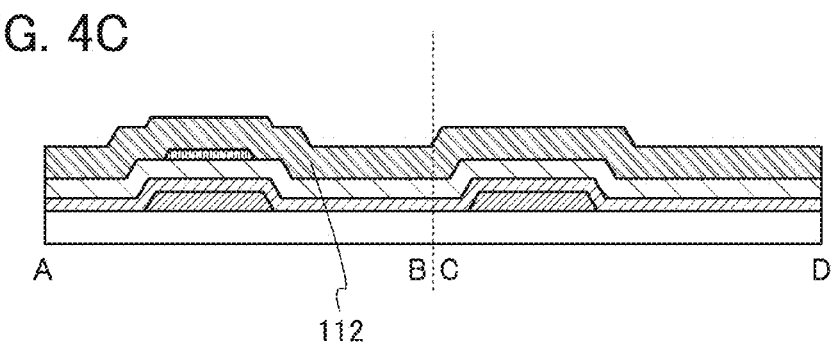

Next, a conductive film 112 to be the source electrode 112a, the drain electrode 112b, and the second wiring 112c is formed over the first insulating film 108 and the oxide semiconductor film 110 (see FIG. 4C).

The source electrode 112a, the drain electrode 112b, and the second wiring 112c can be formed using the conductive film 112 having a single-layer structure or a stacked-layer structure with any of metals such as aluminum, titanium, chromium, nickel, copper, yttrium, zirconium, molybdenum, silver, tantalum, and tungsten, or an alloy containing any of these metals as its main component. In particular, one or more elements selected from aluminum, chromium, copper, tantalum, titanium, molybdenum, and tungsten are preferably included. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. The conductive film can be formed by a sputtering method, for example.

Figure 4D:
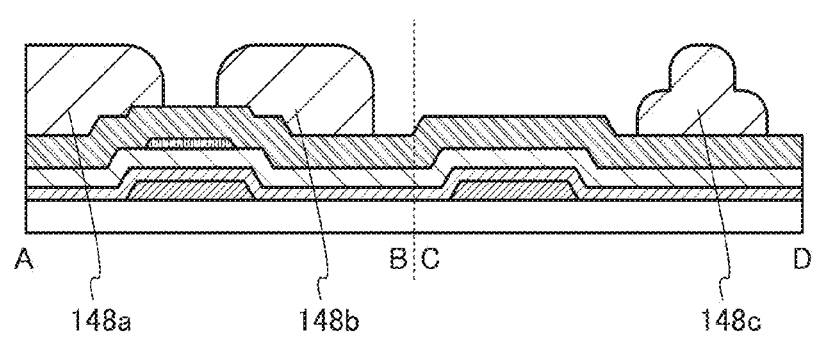

Next, resist masks 148a, 148b, and 148c are formed in desired regions over the conductive film 112 (see FIG. 4D).

The resist masks 148a, 148b, and 148c are formed in a manner that a photosensitive resin is formed over the conductive film 112 and is then exposed to light using a gray tone mask or a half tone mask, whereby only the resist mask 148c in a region to be the second wiring 112c can have a stepwise shape.

The gray tone mask or the half tone mask can be used for, for example, the regions 144a and 144b in FIGS. 3B and 3C.

Figure 5A:
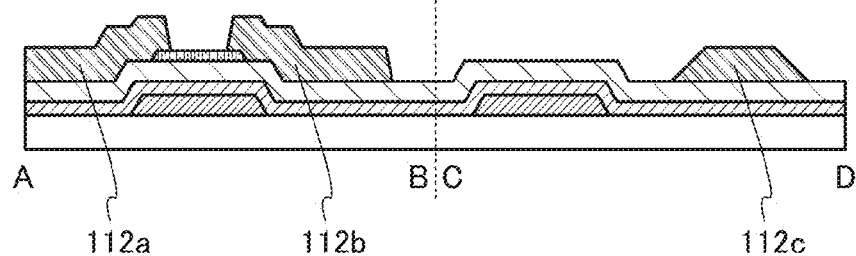
FIGS. 5A to 5D are cross-sectional views illustrating one embodiment of a method for manufacturing a semiconductor device.

Next, the conductive film 112 is etched from the upper surface side of the resist masks 148a, 148b, and 148c and the resist masks 148a, 148b, and 148c are removed after the etching, so that the source electrode 112a, the drain electrode 112b, and the second wiring 112c are formed (see FIG. 5A).

The step of forming the source electrode 112a, the drain electrode 112b, and the second wiring 112c is referred to as a third patterning step.

As described above, the source electrode 112a, the drain electrode 112b, and the second wiring 112c can be formed in the same step, and the end portions of the source electrode 112a and the drain electrode 112b can have different shapes from the end portion of the second wiring 112c.

In this embodiment, the conductive film 112 is etched by a dry etching method.

Note that at the time of etching the conductive film 112, the oxide semiconductor film 110 is partly etched, so that an oxide semiconductor film 110 having a depressed portion is formed in some cases.

The transistor 150 is formed at the stage where the source electrode 112a and the drain electrode 112b are formed over the oxide semiconductor film 110.

Figure 5B:
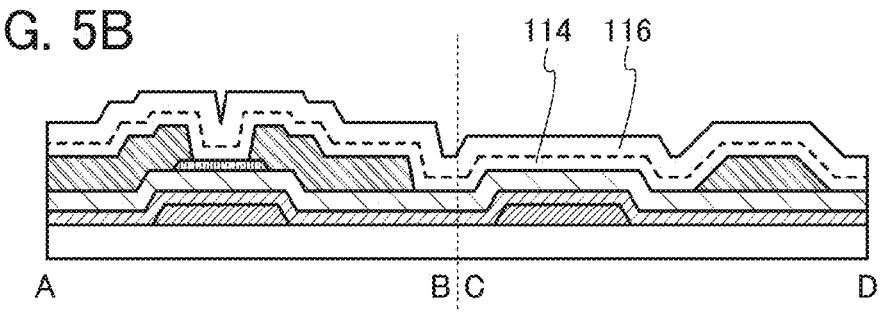

Next, the insulating films 114 and 116 are formed over the first insulating film 108, the oxide semiconductor film 110, the source electrode 112a, the drain electrode 112b, and the second wiring 112c (see FIG. 5B).

For the insulating films 114 and 116, an inorganic insulating material containing oxygen can be used in order to improve the characteristics of the interface with the oxide semiconductor used for the oxide semiconductor film 110. As examples of the inorganic insulating material containing oxygen, a silicon oxide film, a silicon oxynitride film, and the like can be given. The insulating films 114 and 116 can be formed by a PE-CVD method, for example.

The thickness of the insulating film 114 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 116 can be greater than or equal to 30 nm and less than or equal to 500 nm, preferably greater than or equal to 150 nm and less than or equal to 400 nm.

Further, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114, a single-layer structure of the insulating film 116, or a stacked-layer structure including three or more layers may be used.

Figure 5C:
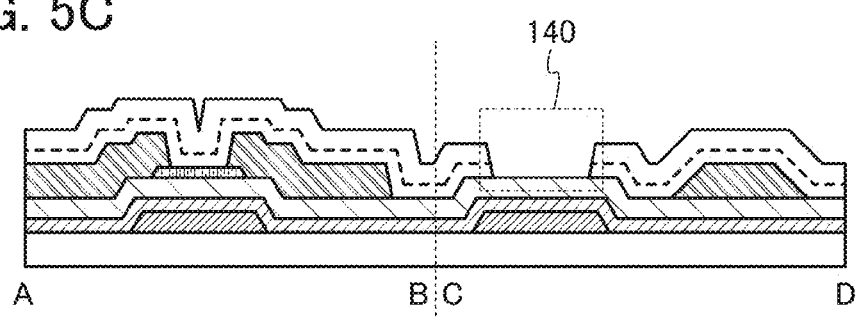

Next, desired regions of the insulating films 114 and 116 are processed, whereby the opening 140 is formed (see FIG. 5C).

The step of forming the opening 140 is referred to as a fourth patterning step.

Note that the opening 140 is formed to expose at least the insulating film 107. In this embodiment, part of the surface of the insulating film 107 is exposed in the opening 140. The opening 140 can be formed by a dry etching method, for example. Note that the method for forming the opening 140 is not limited to the dry etching method, and a wet etching method or a combination of dry etching and wet etching may be employed.

Next, the insulating film 118 is formed over the insulating film 116 to cover the opening 140. By forming the insulating film 118, the second insulating film 120 including the insulating films 114, 116, and 118 is formed over the transistor 150 (see FIG. 5D).

The insulating film 118 is a film formed using a material that can prevent an external impurity, such as water, alkali metal, or alkaline earth metal, from diffusing into the oxide semiconductor film 110, and that further contains hydrogen.

For example, a silicon nitride film, a silicon nitride oxide film, or the like having a thickness of greater than or equal to 150 nm and less than or equal to 400 nm can be used as the insulating film 118. In this embodiment, a 150-nm-thick silicon nitride film is used as the insulating film 118.

The silicon nitride film is preferably formed at a high temperature to have an improved blocking property against impurities or the like; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor used for the oxide semiconductor film 110 and the carrier concentration is increased is caused in some cases; therefore, the upper limit of the temperature is a temperature at which the phenomenon is not caused.

Figure 5D:
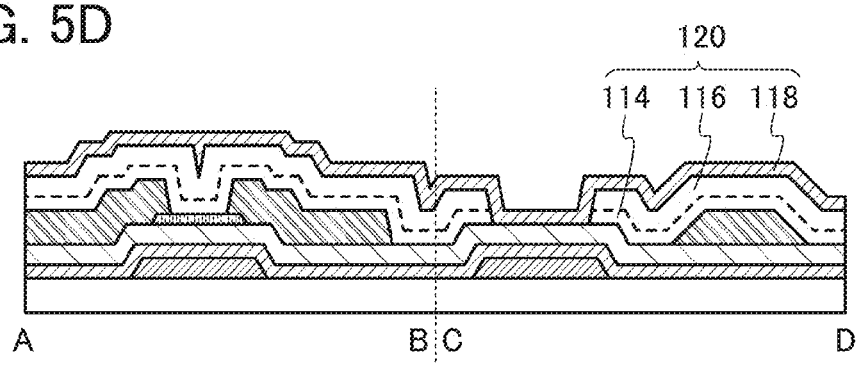

Although not illustrated in FIG. 5D, an insulating film may be further formed above the insulating film 118. As the insulating film, for example, a silicon oxide film formed using an organosilane gas by a PE-CVD method can be used. The silicon oxide film can be formed to a thickness of 300 nm to 600 nm inclusive. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); and the like. For example, the silicon oxide film is formed using an organosilane gas and oxygen by a PE-CVD method at a substrate temperature of 200° C. or higher and 550° C. or lower, preferably 220° C. or higher and 500° C. or lower, further preferably 300° C. or higher and 450° C. or lower.

The insulating film formed over the insulating film 118 can smooth an uneven surface caused by the transistor 150 or the like. Furthermore, since the insulating film is formed using an inorganic material, the insulating film contains fewer impurities that adversely affect the oxide semiconductor film 110 than a resin planarization film using an organic material, which is preferable.

Figure 6A:
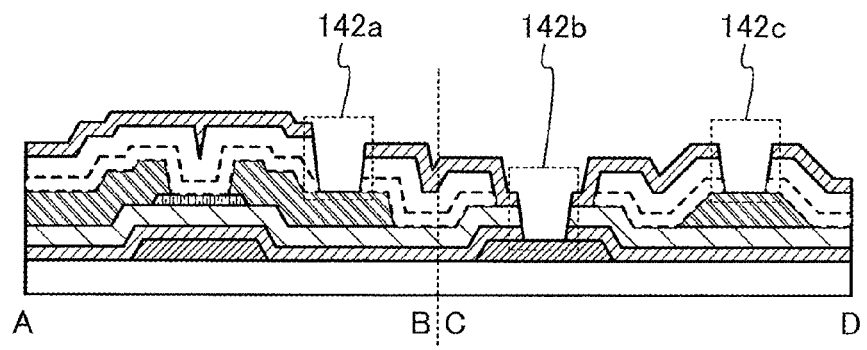
FIGS. 6A and 6B are cross-sectional views illustrating one embodiment of a method for manufacturing a semiconductor device.
Figure 6B:
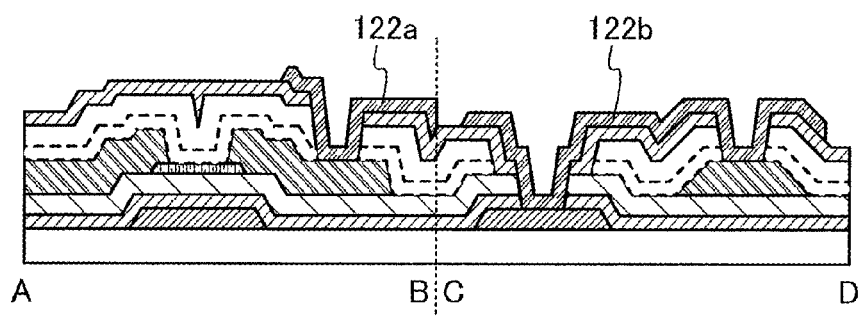

Next, desired regions of the insulating films 114, 116, and 118 are processed, whereby the openings 142a, 142b, and 142c are formed (see FIG. 6A).

The step of for the openings 142a, 142b, and 142c is referred to as a fifth patterning step.

The opening 142a is formed to expose part of the drain electrode 112b. The opening 142b is formed to expose part of the first wiring 104b. The opening 142c is formed to expose part of the second wiring 112c. The openings 142a, 142b, and 142c can be formed by a dry etching method, for example. Note that the method for forming the openings 142a, 142b, and 142c is not limited to the dry etching method, and a wet etching method or a combination of dry etching and wet etching may be employed.

Next, a conductive film is formed over the insulating film 118 to cover the openings 142a, 142b, and 142c and processed into desired regions, whereby the conductive film 122a serving as a pixel electrode and the conductive film 122b serving as a third wiring are formed. At this stage, the connection portion 160 is formed (see FIG. 6B).

The step of forming the conductive films 122a and 122b is referred to as a sixth patterning step.

The distance between the top end portion and the bottom end portion of the second wiring 110c in the connection portion 160 is longer than the distance between the top end portion and the bottom end portion of each of the source electrode 112a and the drain electrode 112b in the transistor 150. In other words, the taper angle of the end portion of the second wiring 110c is smaller than those of the source electrode 112a and the drain electrode 112b. Here, the taper angle refers to a tilt angle formed by the bottom surface and the side surface of each of the source electrode 112a, the drain electrode 112b, and the second wiring 112c when the source electrode 112a, the drain electrode 112b, and the second wiring 112c are observed in a direction perpendicular to their cross sections. A taper angle of the side surface with continuous curvature is a tilt angle formed by a bottom surface and a given point of the side surface with continuous curvature of each of the source electrode 112a, the drain electrode 112b, and the second wiring 112c.

The second wiring 112c has the above shape; thus, the coverage with the conductive film 122b serving as the third wiring can be improved.

In the connection portion 160, the first wiring 104b is connected to the second wiring 110c through the conductive film 122b serving as the third wiring.

For the conductive film used as the conductive films 122a and 122b, an oxide containing indium may be used. For example, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. The conductive film that can be used as the conductive films 122a and 122b can be formed by a sputtering method, for example.

Through the above steps, the transistor 150 and the connection portion 160 are formed over the substrate 102.

In the semiconductor device of one embodiment of the present invention, the transistor 150 and the connection portion 160 can be formed over the same substrate using six masks (through six patterning steps). Thus, a semiconductor device with high productivity can be provided.

Figure 15A:
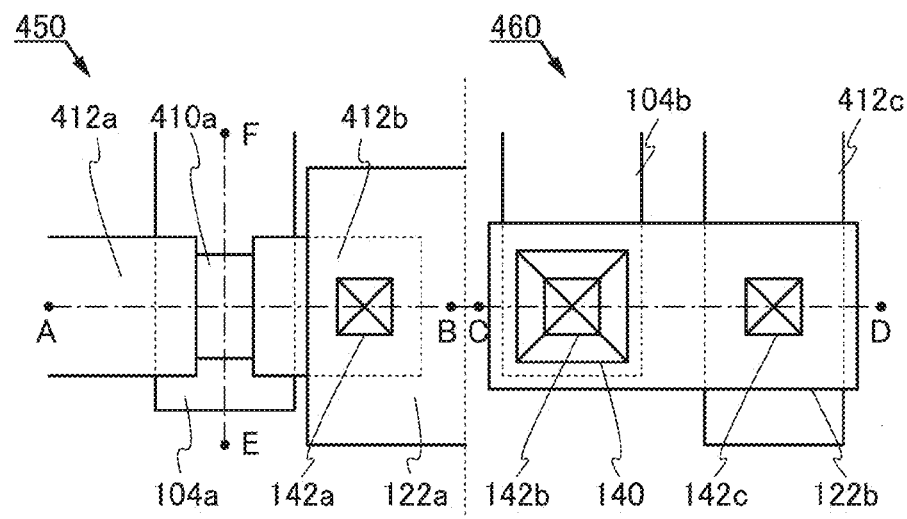
FIGS. 15A to 15C are a top view and cross-sectional views illustrating one embodiment of a semiconductor device.
Figure 15B:
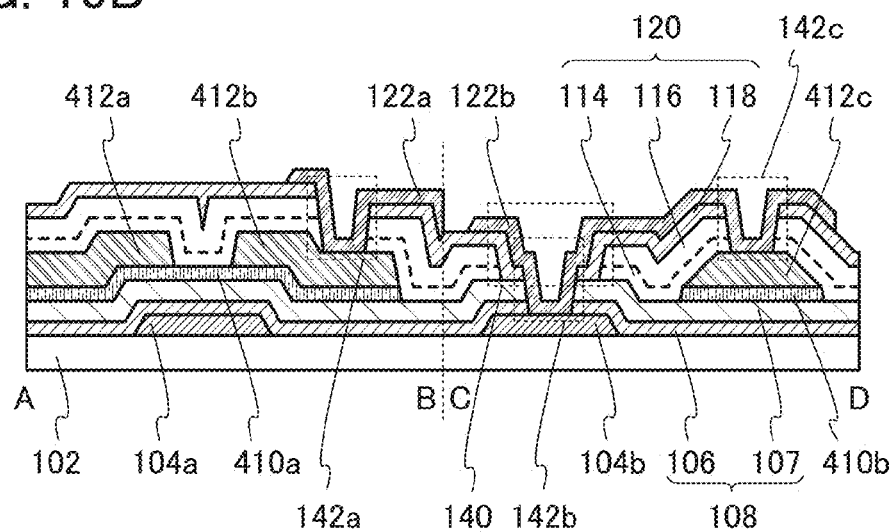
Figure 15C:
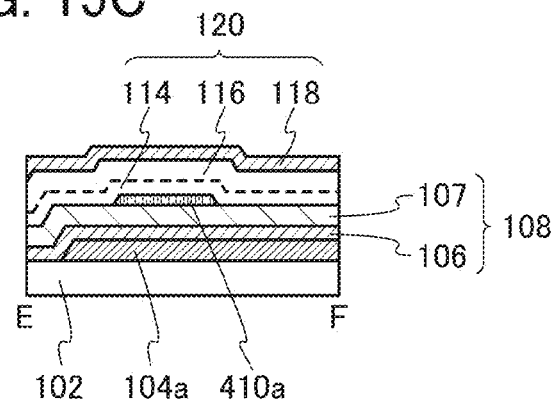

Next, a modification example of the semiconductor device of one embodiment of the present invention in FIGS. 1A and 1B is described with reference to FIGS. 15A to 15C. In FIGS. 15A to 15C, portions similar to those in FIGS. 1A and 1B and portions having functions similar to those in FIGS. 1A and 1B are denoted by the same reference numerals, and description thereof is not repeated.

<Structural Example (Modification Example) of Semiconductor Device>

FIG. 15A is a top view of the semiconductor device of one embodiment of the present invention, and FIG. 15B is across-sectional view taken along a dashed-dotted line A-B and a dashed-dotted line C-D shown in FIG. 15A. FIG. 15C is a cross-sectional view taken along a dashed-dotted line E-F shown in FIG. 15A. Note that in FIG. 15A, some components of the semiconductor device (e.g., an insulating film serving as agate insulating film) are not illustrated to avoid complexity.

The semiconductor device in FIGS. 15A, 15B, and 15C includes a transistor 450 and a connection portion 460.

The transistor 450 includes agate electrode 104a over a substrate 102, a first insulating film 108 formed over the gate electrode 104a, an oxide semiconductor film 410a formed in a position over the first insulating film 108 and overlapping with the gate electrode 104a, and a source electrode 412a and a drain electrode 412b that are electrically connected to the oxide semiconductor film 410a.

FIGS. 15B and 15C illustrate an example in which the first insulating film 108 has a two-layer structure of an insulating film 106 and an insulating film 107.

In addition, over the transistor 450, specifically over the oxide semiconductor film 410a, the source electrode 412a, and the drain electrode 412b, a second insulating film 120 is formed. FIGS. 15B and 15C illustrate an example in which the second insulating film 120 has a three-layer structure of insulating films 114, 116, and 118.

An opening 142a reaching the drain electrode 412b is formed in the second insulating film 120. In addition, a conductive film 122a serving as a pixel electrode is formed over the second insulating film 120 to cover the opening 142a. The conductive film 122a is connected to the drain electrode 412b of the transistor 450.

The connection portion 460 includes a first wiring 104b over the substrate 102, the first insulating film 108 over the first wiring 104b, an opening 142b provided in the first insulating film 108, an oxide semiconductor film 410b over the first insulating film 108, a second wiring 412c over the oxide semiconductor film 410b, the second insulating film 120 over the second wiring 412c, an opening 140 provided in the second insulating film 120, and a conductive film 122b serving as a third wiring that is formed to cover the openings 142b and 140 and connects the first wiring 104b and the second wiring 412c.

Note that the first wiring 104b is formed in the same steps as the gate electrode 104a of the transistor 450. In other words, the first wiring 104b and the gate electrode 104a of the transistor 450 are formed on the same surface. Moreover, the second wiring 412c is formed in the same steps as the source electrode 412a and the drain electrode 412b of the transistor 450. In other words, the second wiring 412c and the source electrode 412a and the drain electrode 412b of the transistor 450 are formed on the same surface.

The semiconductor device of FIGS. 15A to 15C is different from that of FIGS. 1A and 1B in the structure of the oxide semiconductor film 410a, the oxide semiconductor film 410b, the source electrode 412a, the drain electrode 412b, and the second wiring 412c. For a material which can be used for the oxide semiconductor films 410a and 410b, a material similar to that of the oxide semiconductor film 110 of the semiconductor device in FIGS. 1A and 1B can be referred to. Furthermore, for a material that can be used for the source electrode 412a, the drain electrode 412b, and the second wiring 412c, the material that can be used for the source electrode 112a, the drain electrode 112b, and the second wiring 112c of the semiconductor device in FIGS. 1A and 1B can be referred to.

In the semiconductor device in FIGS. 15A to 15C, the oxide semiconductor film to be the oxide semiconductor films 410a and 410b and the conductive film to be the source electrode 412a, the drain electrode 412b, and the second wiring 412c are formed in the same steps, whereby the number of masks can be reduced and manufacturing cost can be reduced.

<Method for Manufacturing Semiconductor Device (Modification Example)>

A method for manufacturing the semiconductor device of one embodiment of the present invention in FIGS. 15A to 15C is described below with reference to FIGS. 16A to 16E and FIGS. 17A to 17D.

First, a conductive film is formed over the substrate 102 and processed by a first patterning step and an etching step, whereby the gate electrode 104a and the first wiring 104b are formed. After that, the first insulating film 108 including the insulating films 106 and 107 is formed over the gate electrode 104a and the first wiring 104b. The steps up to this stage are similar to those in FIG. 4A.

Then, the oxide semiconductor film 410 and the conductive film 412 are formed over the insulating film 107 (see FIG. 16A).

Next, resist masks 448a and 448b are formed in desired regions over the conductive film 412 (see FIG. 16B).

The resist masks 448a and 448b are formed in a manner that a photosensitive resin is formed over the conductive film 412 and is exposed to light using a gray tone mask or a half tone mask. With the resist masks 448a and 448b, an oxide semiconductor film to be a channel formation region and a source electrode and a drain electrode can be formed at the same time. Furthermore, the resist mask 448b in a region to be the second wiring 412c can have a stepwise shape. As the resist masks 448a and 448b, a negative-type or positive-type photosensitive resin can be used. The positive-type photosensitive resin is preferably used because a minute shape can be formed.

Figure 18:
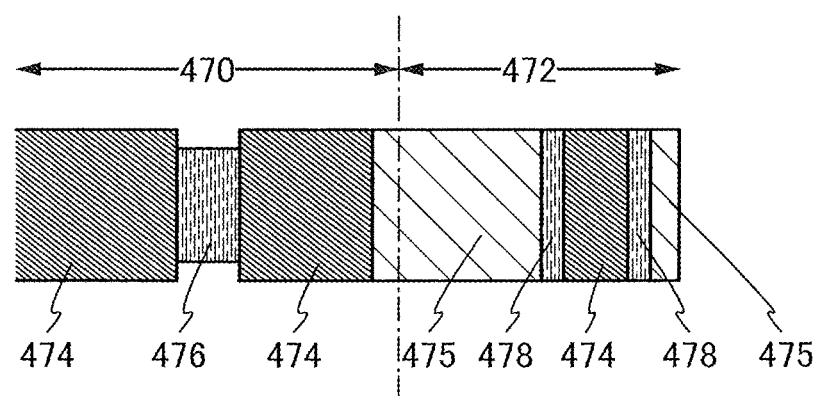
FIG. 18 illustrates a gray tone mask.

Here, the gray tone mask used for forming the resist masks 448a and 448b is described with reference to FIG. 18. FIG. 18 is atop schematic view of the gray tone mask. For example, the gray tone mask includes a transistor portion 470 and a connection portion 472. The transistor portion 470 includes regions 474, a region 475 and a region 476, and the connection portion 472 includes a region 474, regions 475 and regions 478.

For example, the regions 474 are referred to as light-blocking regions, the regions 475 are referred to as transmissive regions, the region 476 is referred to as a first semi-transmissive region, and the regions 478 are referred to as a second semi-transmissive regions. Furthermore, the light transmittance in the regions 475 is higher than that in the region 476, the light transmittance in the region 476 is higher than that in the regions 478, and the light transmittance in the regions 478 is higher than that in the regions 474, whereby the resist masks 448a and 448b as illustrated in FIG. 16B can be formed. As light emitted to the resist masks 448a and 448b, light with an i-line (with a wavelength of 365 nm) and/or light with a g-line (with a wavelength of 436 nm) can be used. Note that an ArF excimer laser, a KrF excimer laser, or the like whose wavelength is shorter than that of light with an i-line may be used.

Next, the conductive film 412 and the oxide semiconductor film 410 are etched from the upper surface side of the resist masks 448a and 448b. In the etching step, the resist mask 448a recedes or is reduced, so that the resist mask 448a is divided into resist masks 448c and 448d. In addition, the resist mask 448b recedes or is reduced, so that a resist mask 448e is formed. At this stage, the oxide semiconductor film 410 is divided and the oxide semiconductor films 410a and 410b are formed (see FIG. 16C). After that, the conductive film 412 is etched and the resist masks 448c, 448d, and 448e are removed after the etching, no that the source electrode 412a, the drain electrode 412b, and the second wiring 412c are formed (see FIG. 16D).

The step of forming the oxide semiconductor films 410a and 410b, the source electrode 412a, the drain electrode 412b, and the second wiring 412c is referred to as a second patterning step.

As described above, at the time of forming the oxide semiconductor films 410a and 410b, the source electrode 412a, the drain electrode 412b, and the second wiring 412c, a resist is formed by using the gray tone mask or the half tone mask, whereby the number of masks can be reduced by one.

As described above, the shapes of the resist masks 448a and 448b are made different from each other, whereby the end portions of the source electrode 412a and the drain electrode 412b can have different shapes from the end portion of the second wiring 412c.

In this embodiment, the oxide semiconductor film 410 and the conductive film 412 are etched by a dry etching method.

Note that in etching of the oxide semiconductor film 410 and the conductive film 412, the oxide semiconductor film 410a is partly etched depending on the thickness or the shape of the resist mask 448a, so that an oxide semiconductor film 410a having a depressed portion is formed in some cases.

At this stage, the transistor 450 is formed.

Next, the insulating films 114 and 116 are formed over the first insulating film 108, the oxide semiconductor film 410a, the source electrode 412a, the drain electrode 412b, and the second wiring 412c see FIG. 16E).

Figure 17A:
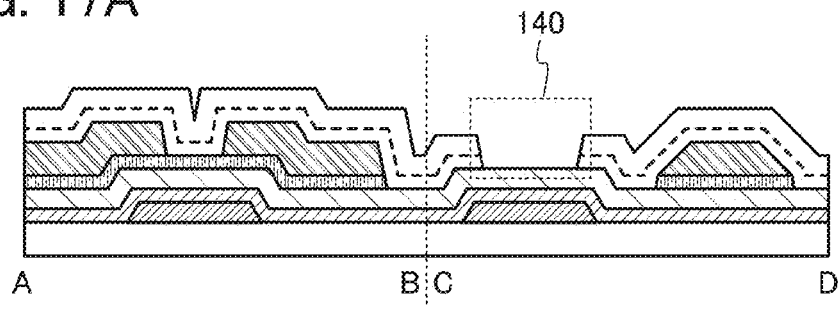
FIGS. 17A to 17D are cross-sectional views illustrating one embodiment of a method for manufacturing a semiconductor device.
Figure 17B:
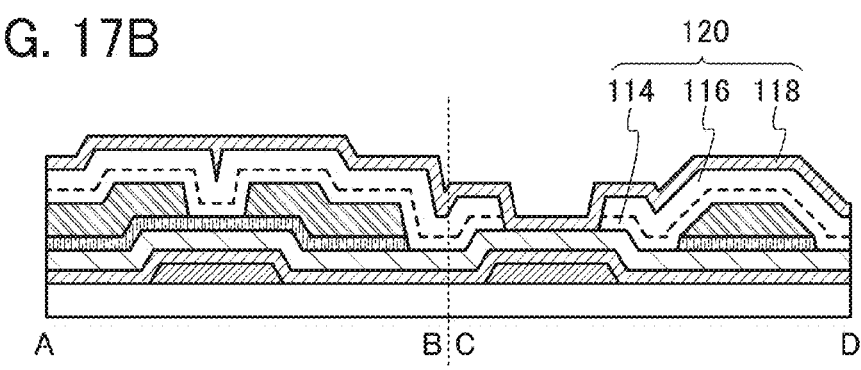

Next, desired regions of the insulating films 114 and 116 are processed, whereby the opening 140 is formed (see FIG. 17A).

The step of forming the opening 140 is referred to as a third patterning step.

Next, the insulating film 118 is formed over the insulating film 116 to cover the opening 140. By forming the insulating film 118, the second insulating film 120 including the insulating films 114, 116, and 118 are formed over the transistor 450 (see FIG. 17B).

Figure 17C:
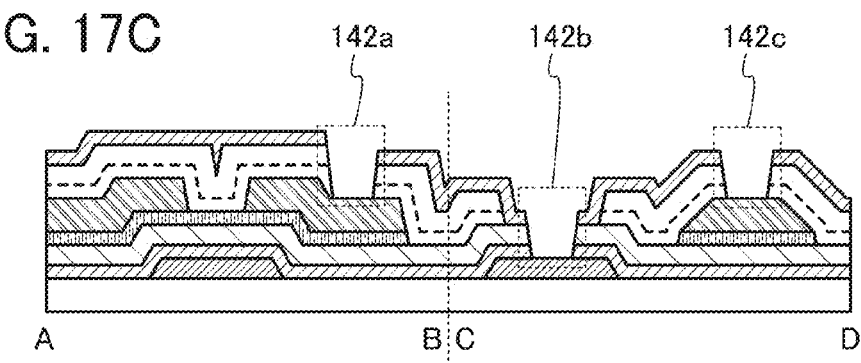

Next, desired regions of the insulating films 114, 116, and 118 are processed, whereby the openings 142a, 142b, and 142c are formed (see FIG. 17C).

The step of forming the openings 142a, 142b, and 142c is referred to as a fourth patterning step.

Next, a conductive film is formed over the insulating film 118 to cover the openings 142a, 142b, and 142c and processed into desired regions, whereby the conductive film 122a serving as a pixel electrode and the conductive film 122b serving as a third wiring are formed. At this stage, the connection portion 460 is formed see FIG. 17D).

The step of forming the conductive films 122a and 122b is referred to as a fifth patterning step.

The distance between the top end portion and the bottom end portion of the second wiring 410c in the connection portion 460 is longer than the distance between the top end portion and the bottom end portion of each of the source electrode 412a and the drain electrode 412b in the transistor 450. In other words, the taper angle of the end portion of the second wiring 410c is smaller than those of the source electrode 412a and the drain electrode 412b.

The second wiring 412c has the above shape; thus, the coverage with the conductive film 122b serving as the third wiring can be improved.

In the connection portion 460, the first wiring 104b is connected to the second wiring 410c through the conductive film 122b serving as the third wiring.

Through the above steps, the transistor 450 and the connection portion 460 are formed over the substrate 102.

In the semiconductor device of one embodiment of the present invention, the transistor 450 and the connection portion 460 can be formed over the same substrate using five masks (through five patterning steps). Thus, a semiconductor device with high productivity can be provided.

This embodiment can be combined with any of the other embodiments in this specification as appropriate.

(Embodiment 2)

In this embodiment, a semiconductor device of one embodiment of the present invention is described with reference to FIG. 7, FIGS. 8A to 8D, and FIGS. 9A to 9C. Note that portions similar to those in FIGS. 1A and 1B, FIGS. 2A to 2D, FIGS. 3A to 3C, FIGS. 4A to 4D, FIGS. 5A to 5D, and FIGS. 6A and 6B are denoted by the same reference numerals, and description thereof is omitted.

Figure 7:
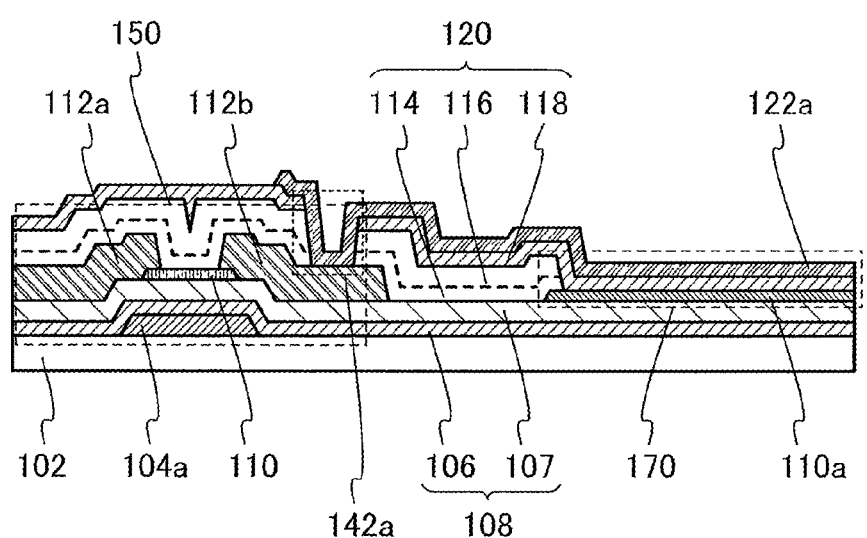
FIG. 7 is a cross-sectional view illustrating one embodiment of a semiconductor device.

A semiconductor device in FIG. 7 is a structural example in which a capacitor 170 is connected to the transistor 150 described in Embodiment 1.

The transistor 150 includes a gate electrode 104a over a substrate 102, a first insulating film 108 formed over the gate electrode 104a, an oxide semiconductor film 110 formed in a position over the first insulating film 108 and overlapping with the gate electrode 104a, and a source electrode 112a and a drain electrode 112b that are electrically connected to the oxide semiconductor film 110.

In addition, over the transistor 150, specifically over the oxide semiconductor film 110, the source electrode 112a, and the drain electrode 112b, a second insulating film 120 is formed. FIG. 7 illustrates an example in which the second insulating film 120 has a three-layer structure of insulating films 114, 116, and 118.

Moreover, an opening 142a reaching the drain electrode 112b is formed in the second insulating film 120. In addition, a conductive film 122a serving as a pixel electrode is formed over the second insulating film 120 to cover the opening 142a. The conductive film 122a is connected to the drain electrode 112b of the transistor 150.

The capacitor 170 includes an oxide semiconductor film 110a, the insulating films 114 and 116 which are formed to overlap with part of an end portion of the oxide semiconductor film 110a, the insulating film 118 formed over the insulating film 116 and the oxide semiconductor film 110a, and the conductive film 122a formed over the insulating film 118.

The capacitor 170 includes a dielectric film between a pair of electrodes. Specifically, the oxide semiconductor film 110a as a conductive film serves as one of the pair of electrodes, and the conductive film 122a serves as the other of the pair of electrodes. The oxide semiconductor film 110a is formed in the same step as the oxide semiconductor film 110 of the transistor 150, in other words, is formed on the surface on which the oxide semiconductor film 110 is formed. The conductive film 122a serves as the pixel electrode and the electrode of the capacitor. Furthermore, as the dielectric film of the capacitor 170, the insulating film 118 serving as part of the second insulating film of the transistor 150 is used.

In this manner, the transistor 150 and the capacitor 170 can be formed at the same time. With the structure in which the capacitor 170 is connected to the transistor 150, the semiconductor device of one embodiment of the present invention can be used in a pixel portion of a liquid crystal display device, for example.

Moreover, although not illustrated in FIG. 7, the connection portion 160 in FIGS. 1A and 1B may be formed at the same time as the transistor 150 and the capacitor 170.

In addition, the capacitor 170 has a light-transmitting property. Specifically, the oxide semiconductor film 110a serving as the one of the pair of electrodes, the conductive film 122a serving as the other of the pair of electrodes, and the insulating film 118 serving as the dielectric film are formed using a light-transmitting oxide semiconductor film, a light-transmitting conductive film, and a light-transmitting insulating film, respectively. The capacitor 170 having a light-transmitting property can be formed in a large area.

Here, a method for manufacturing the semiconductor device in FIG. 7 is described with reference to FIGS. 8A to 8D and FIGS. 9A to 9C.

First, the substrate 102 is prepared. Next, a conductive film is formed over the substrate 102 and processed into a desired region, so that the gate electrode 104a is formed. After that, the first insulating film 108 including the insulating films 106 and 107 is formed over the substrate 102 and the gate electrode 104a. Then, the oxide semiconductor film 110 and the oxide semiconductor film 110a are formed over the first insulating film 108 (see FIG. 8A).

The step of forming the gate electrode 104a is referred to as a first patterning step. The step of forming the oxide semiconductor film 110 and the oxide semiconductor film 110a is referred to as a second patterning step.

Figure 8A:
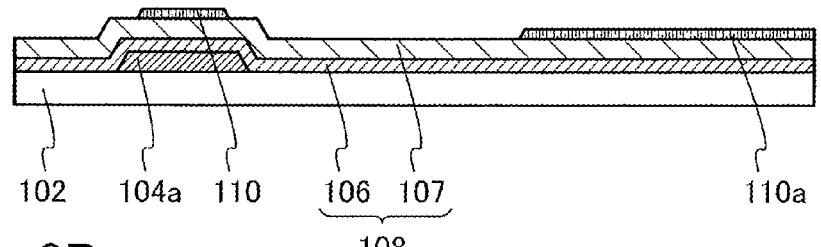
FIGS. 8A to 8D are cross-sectional views illustrating one embodiment of a method for manufacturing a semiconductor device.
Figure 8B:
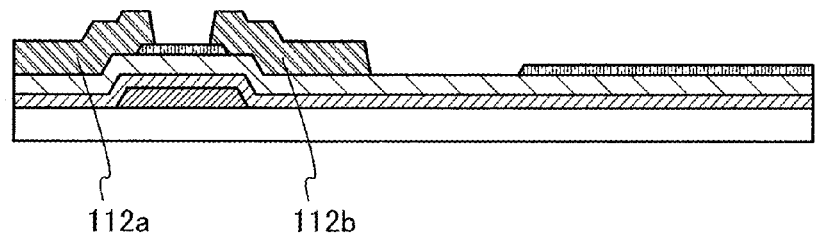

Next, a conductive film is formed over the first insulating film 108, the oxide semiconductor film 110, and the oxide semiconductor film 110a, and the conductive film is processed into desired regions, whereby the source electrode 112a and the drain electrode 112b are formed (see FIG. 8B).

The step of forming the source electrode 112a and the drain electrode 112b is referred to as a third patterning step.

The transistor 150 is formed at the stage where the source electrode 112a and the drain electrode 112b are formed over the oxide semiconductor film 110.

Figure 8C:
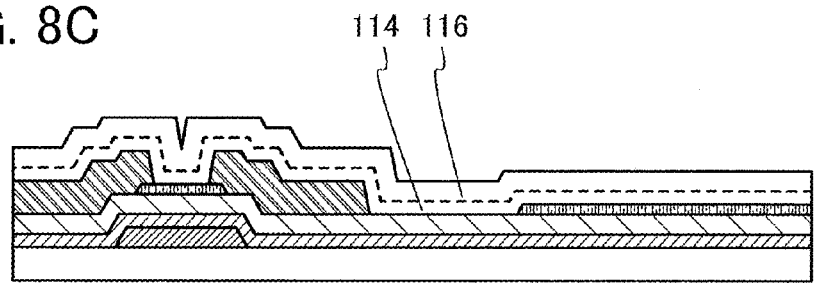

Next, the insulating films 114 and 116 are formed over the first insulating film 108, the oxide semiconductor film 110, the oxide semiconductor film 110a, the source electrode 112a and the drain electrode 112b (see FIG. 8C).

Figure 8D:
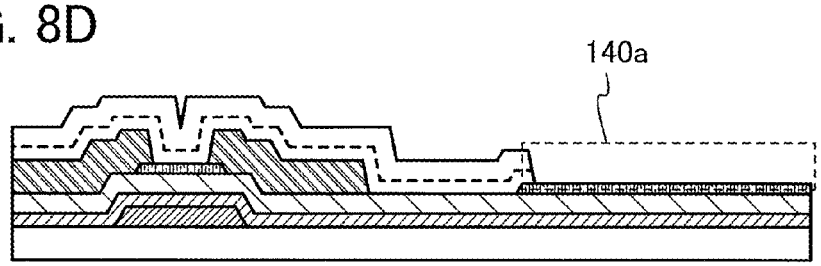

Next, desired regions of the insulating films 114 and 116 are processed, whereby an opening 140a is formed (see FIG. 8D).

The step of forming the opening 140a is referred to as a fourth patterning step. Furthermore, the opening 140a can be formed at the same time as the opening 140 illustrated in FIG. 5C.

Note that the opening 140a is formed to expose at least part of the oxide semiconductor film 110a. In this embodiment, part of the surface of the oxide semiconductor film 110a is exposed in the opening 140a. The opening 140a can be formed by a dry etching method, for example. Note that the method for forming the opening 140a is not limited to the dry etching method, and a wet etching method or a combination of dry etching and wet etching may be employed.

Next, the insulating film 118 is formed over the insulating film 116 and the oxide semiconductor film 110a to cover the opening 140a. By forming the insulating film 118, the second insulating film 120 is formed over the transistor 150 (see FIG. 9A).

The insulating film 118 is a film formed using a material that can prevent an external impurity, such as water, alkali metal, or alkaline earth metal, from diffusing into the oxide semiconductor film 110, and that further contains hydrogen. Thus, when hydrogen in the insulating film 118 is diffused to the oxide semiconductor film 110a, hydrogen is bonded to oxygen or to oxygen vacancies to generate electrons that are carriers in the oxide semiconductor film 110a. As a result, the conductivity of the oxide semiconductor film 110a is increased, so that the oxide semiconductor film 110a becomes a conductive film having a light-transmitting property.

In this embodiment, the method in which hydrogen is supplied from the insulating film 118 in contact with the oxide semiconductor film 110a is described, but the present invention is not limited to this. For example, a mask is formed over the oxide semiconductor film 110 to serve as a channel of the transistor 150, and a region not covered with the mask can be supplied with hydrogen. For example, an ion doping apparatus or the like can be used to introduce hydrogen into the oxide semiconductor film 110a.

Figure 9A:
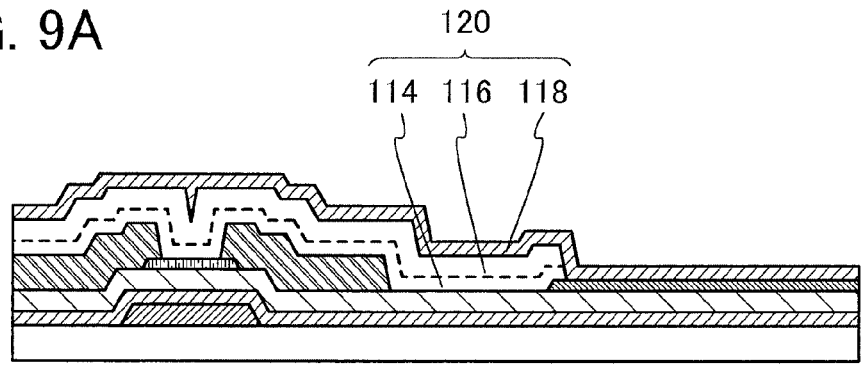
FIGS. 9A to 9C are cross-sectional views illustrating one embodiment of a method for manufacturing a semiconductor device.
Figure 9B:
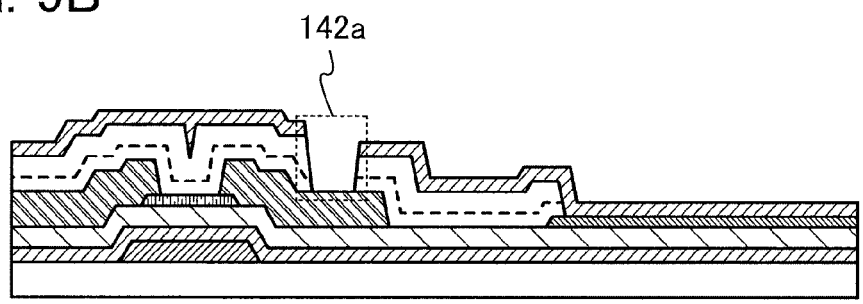
Figure 9C:
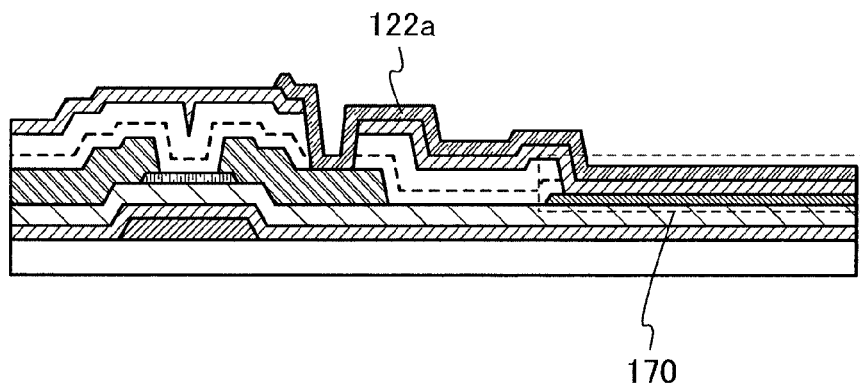

Next, desired regions of the insulating films 114, 116, and 118 are processed, whereby the opening 142a is formed see FIG. 9B).

The step of forming the opening 142a is referred to as a fifth patterning step.

The opening 142a is formed to expose part of the drain electrode 112b. The opening 142a can be formed by a dry etching method, for example. Note that the method for forming the opening 142a is not limited to the dry etching method, and a wet etching method or a combination of dry etching and wet etching may be employed.

Next, a conductive film is formed over the insulating film 118 to cover the opening 142a and processed into a desired region, whereby the conductive film 122a serving as a pixel electrode and an electrode of the capacitor is formed. At this stage, the capacitor 170 is formed (see FIG. 9C).

The step of forming the conductive film 122a is referred to as a sixth patterning step.

Through the above steps, the transistor 150 and the capacitor 170 can be formed over the substrate 102.

In the semiconductor device of one embodiment of the present invention, the transistor 150 and the capacitor 170 can be formed over the same substrate using six masks (through six patterning steps). Thus, a semiconductor device with high productivity can be provided.

This embodiment can be combined with any of the other embodiments in this specification as appropriate.

(Embodiment 3)

In this embodiment, a structure of a transistor that can be used in a semiconductor device of one embodiment of the present invention is described with reference to FIGS. 10A and 10B.

Figure 10A:
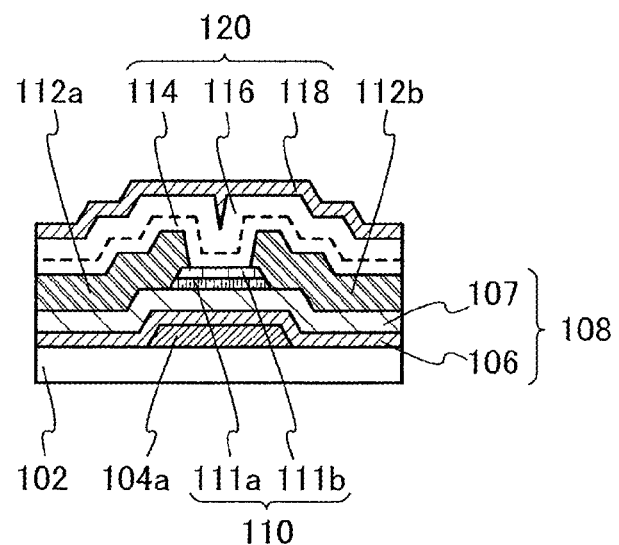
FIGS. 10A and 10B are a cross-sectional view and a band diagram illustrating one embodiment of a semiconductor device.

A semiconductor device illustrated in FIG. 10A is an example in which a stack of an oxide semiconductor film 111a and an oxide film 111b is used as the oxide semiconductor film 110 of the transistor 150 included in the above-described semiconductor device. Thus, the other components are the same as those of the transistor 150; hence, the above description can be referred to.

Here, the oxide semiconductor 111a and the oxide film 111b are described below in detail.

Metal oxides used for the oxide semiconductor film 111a and the oxide film 111b preferably contain at least one same constituent element. Alternatively, the constituent elements of the oxide semiconductor film 111a may be the same as those of the oxide film 111b and the composition of the constituent elements of the oxide semiconductor film 111a may be different from those of the oxide film 111b.

In the case where the oxide semiconductor film 111a is an In-M-Zn oxide (M represents Al, Ga, Ge, Y, Zr, Sn, La, Ce, or Hf), it is preferable that the atomic ratio of metal elements of a sputtering target used for forming a film of the In-M-Zn oxide satisfy In≥M and Zn≥M. As the atomic ratio of metal elements of the sputtering target, In:M:Zn=1:1:1, In:M:Zn=5:5:6 (1:1:1.2), In:M:Zn=3:1:2, and the like are preferable. Note that the proportion of the atomic ratio of the oxide semiconductor film 111a formed using the above-described sputtering target varies within a range of ±20% as an error.

When an In-M-Zn oxide is used for the oxide semiconductor film 111a, the proportions of In and M, not taking Zn and O into consideration, is preferably as follows: the atomic percentage of In is greater than or equal to 25 at. % and the proportion of M is less than 75 at. %; more preferably, the proportion of In is greater than or equal to 34 at. % and the proportion of M is less than 66 at. %.

The energy gap of the oxide semiconductor film 111a is 2 eV or more, preferably 2.5 eV or more, further preferably 3 eV or more. The off-state current of the transistor can be reduced by using an oxide semiconductor having a wide energy gap.

The thickness of the oxide semiconductor film 111a is greater than or equal to 3 nm and less than or equal to 200 nm, preferably greater than or equal to 3 nm and less than or equal to 100 nm, further preferably greater than or equal to 3 nm and less than or equal to 50 nm.

The oxide film 111b is typically In—Ga oxide, In—Zn oxide, or an In-M-Zn oxide (M represents Al, Ga, Ge, Y, Zr, Sn, La, Ce, or Hf). The energy at the conduction band bottom thereof is closer to a vacuum level than that of the oxide semiconductor film 111a is, and typically, the difference between the energy at the conduction band bottom of the oxide film 111b and the energy at the conduction band bottom of the oxide semiconductor film 111a is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide film 111b and the electron affinity of the oxide semiconductor film 111a is greater than or equal to 0.05 eV, greater than or equal to 0.07 eV, greater than or equal to 0.1 eV, or greater than or equal to 0.15 eV and also less than or equal to 2 eV, less than or equal to 1 eV, less than or equal to 0.5 eV, or less than or equal to 0.4 eV.

When the oxide film 111b contains a larger amount of M in an atomic ratio than the amount of In in an atomic ratio, any of the following effects may be obtained: (1) the energy gap of the oxide film 111b is widened; (2) the electron affinity of the oxide film 111b decreases; (3) an impurity from the outside is blocked; (4) an insulating property increases as compared to the oxide semiconductor film 111a. Further, oxygen vacancies are less likely to be generated in the oxide film 111b containing a larger amount of M in an atomic ratio than the amount of In in an atomic ratio because M is a metal element which is strongly bonded to oxygen.

When an In-M-Zn oxide is used for the oxide film 111b, the proportions of In and M, not taking Zn and O into consideration, is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %.

Further, in the case where each of the oxide semiconductor film 111a and the oxide film 111b is an In-M-Zn oxide (M represents Al, Ga, Ge, Y, Zr, Sn, La, Ce, or Hf), the proportion of M atoms in the oxide film 111b is higher than the proportion of M atoms in the oxide semiconductor film 111a. Typically, the proportion of M atoms in the oxide film 111b is higher than or equal to 1.5 times, preferably higher than or equal to 2 times, further preferably higher than or equal to 3 times as large as that in the oxide semiconductor film 111a.

In the case where the oxide film 111b has an atomic ratio of In, M, and Zn which is $x_1:y_1:z_1$ and the oxide semiconductor film 111a has an atomic ratio of In, M, and Zn which is $x_2:y_2:z_2$, $y_1/x_1$ is larger than $y_2/x_2$, preferably $y_1/x_1$ is 1.5 times or more as large as $y_2/x_2$. It is further preferable that $y_1/x_1$ be twice or more as large as $y_2/x_2$. It is still further preferable that $y_1/x_1$ be three or more times as large as $y_2/x_2$.

In this case, it is preferable that in the oxide semiconductor film 111a, $y_2$ be higher than or equal to $x_2$ because the transistor including an oxide semiconductor can have stable electrical characteristics. However, when $y_2$ is larger than or equal to three or more times $x_2$, the field-effect mobility of the transistor including an oxide semiconductor is reduced. Thus, it is preferable that $y_2$ be lower than three times $x_2$.

Further, in the case where the oxide semiconductor film 111a and the oxide film 111b are each an In-M-Zn oxide film, the atomic ratio of metal elements of a sputtering target used for forming the In-M-Zn oxide film preferably satisfies M>In, and more preferably, Zn also satisfies Zn≥M. As the atomic ratio of metal elements of the sputtering target, In:Ga:Zn=1:3:2, In:Ga:Zn=1:3:3, In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:6:4, In:Ga:Zn=1:6:5, In:Ga:Zn=1:6:6, In:Ga:Zn=1:6:7, In:Ga:Zn=1:6:8, In:Ga:Zn=1:6:9, and In:Ga:Zn=1:6:10 are preferable. Note that the proportion of each metal element in the atomic ratio of each of the oxide semiconductor film 111a and the oxide film 111b formed using the above-described sputtering target varies within a range of ±20% as an error.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor film 111a be set to appropriate values.

Note that the oxide film 111b also functions as a film which relieves damage to the oxide semiconductor film 111a at the time of forming the insulating film 114 or the insulating film 116 later. The thickness of the oxide film 111b is greater than or equal to 3 nm and less than or equal to 100 nm, preferably greater than or equal to 3 nm and less than or equal to 50 nm.

When silicon or carbon which is one of elements belonging to Group 14 is contained in the oxide semiconductor film 111a, the number of oxygen vacancies is increased, and the oxide semiconductor film 111a is changed to an n-type. Thus, the concentration of silicon or carbon (the concentration is measured by SIMS) in the oxide semiconductor film 111a or the concentration of silicon or carbon (the concentration is measured by SIMS) in the vicinity of the interface between the oxide film 111b and the oxide semiconductor film 111a is set to be lower than or equal to $2\times10^{18}$ atoms/cm$^3$, preferably lower than or equal to $2\times10^{17}$ atoms/cm$^3$.

Further, the concentration of alkali metal or alkaline earth metal of the oxide semiconductor film 111a, which is measured by SIMS, is lower than or equal to $1\times10^{18}$ atoms/cm$^3$, preferably lower than or equal to $2\times10^{16}$ m atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 111a.

Further, when nitrogen is contained in the oxide semiconductor film 111a, electrons serving as carriers are generated to increase the carrier density, no that the oxide semiconductor film 111a easily becomes n-type. Thus, a transistor including an oxide semiconductor which contains nitrogen is likely to be normally on. For this reason, nitrogen in the oxide semiconductor film 111a is preferably reduced as much as possible; the concentration of nitrogen which is measured by SIMS is preferably set to, for example, lower than or equal to $5 \times 10^{18}$ atoms/cm$^3$.

Note that the oxide semiconductor film 111a and the oxide film 111b are not formed by simply stacking each layer, but are formed to form a continuous junction (here, in particular, a structure in which the energy of the bottom of the conduction band is changed continuously between each film). In other words, a stacked-layer structure in which there exist no impurity which forms a detect level such as a trap center or a recombination center at each interface is provided. If an impurity exists between the oxide semiconductor film 111a and the oxide film 111b which are stacked, a continuity of the energy band is damaged, and the carrier is captured or recombined at the interface and then disappears.

To form the continuous junction, each film needs to be stacked successively without exposure to the atmosphere using a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for the oxide semiconductor film, is removed as much as possible. Alternatively, a turbo-molecular pump is preferably used in combination with a cold trap to prevent backflow of gas especially a gas containing carbon or hydrogen into the chamber through an evacuation system.

Here, a hand structure of the stacked-layer structure included in the transistor 150 is described with reference to FIG. 10B.

Figure 10B:
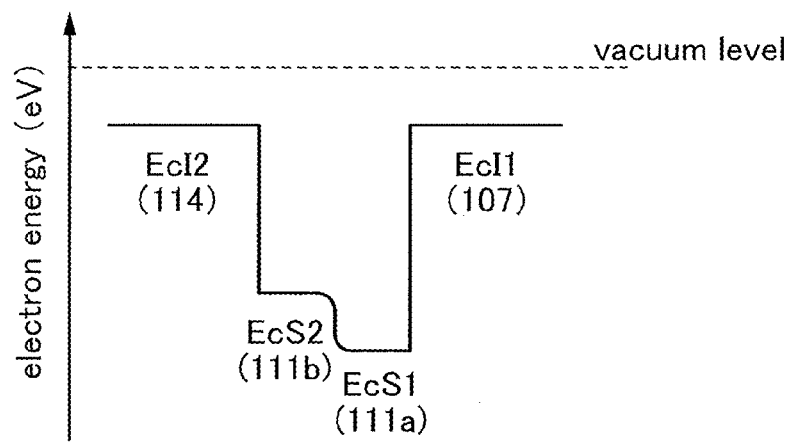

FIG. 10B schematically shows a part of the band structure included in the transistor 150. Here, the case where silicon oxide films are provided as the insulating film 107 and the insulating film 114 is shown. In FIG. 10B, EcI1 denotes the energy of the bottom of the conduction band in the silicon oxide layer used as the insulating film 107; EcS1 denotes the energy of the bottom of the conduction band in the oxide semiconductor film 111a; EcS2 denotes the energy of the bottom of the conduction band in the oxide film 111b; and EcI2 denotes the energy of the bottom of the conduction band in the silicon oxide film used as the insulating film 114.

As shown in FIG. 10B, there is no energy barrier between the oxide semiconductor film 111a and the oxide film 111b, and the energy level of the bottom of the conduction band gradually changes therebetween. In other words, the energy level of the bottom of the conduction band is continuously changed. This is because the oxide semiconductor film 111a contains an element contained in the oxide film 111b and oxygen is transferred between the oxide semiconductor film 111a and the oxide film 111b, so that a mixed layer is formed.

As shown in FIG. 10B, the oxide semiconductor film 111a serves as a well and a channel region is formed in the oxide semiconductor film 111a. Note that since the energies of the bottom of the conduction band of the oxide semiconductor film 111a and the oxide film 111b are continuously changed, it can be said that the oxide semiconductor film 111a and the oxide film 111b have a continuous junction.

Although trap states due to defects or impurities such as silicon or carbon, which is a constituent element of the insulating film 114, might be formed in the vicinity of the interface between the oxide film 111b and the insulating film 114 as shown in FIG. 10B, the oxide semiconductor film 111a can be distanced from the trap states owing to existence of the oxide film 111b. However, when the energy difference between EcS1 and EcS2 is small, an electron in the oxide semiconductor film 111a might reach the trap state by passing over the energy difference. When the electron is captured by the trap state, negative fixed electric charge is generated at the interface with the insulating film, so that the threshold voltage of the transistor shifts in the positive direction. Therefore, it is preferable that the energy difference between EcS1 and EcS2 be 0.1 eV or more, further preferably 0.15 eV or more because a change in the threshold voltage of the transistor is prevented and stable electrical characteristics are obtained.

This embodiment can be combined with any of the other embodiments in this specification as appropriate.

(Embodiment 4)

In this embodiment, a structure of a transistor that can be used in a semiconductor device of one embodiment of the present invention is described with reference to FIGS. 11A to 11C.

Figure 11A:
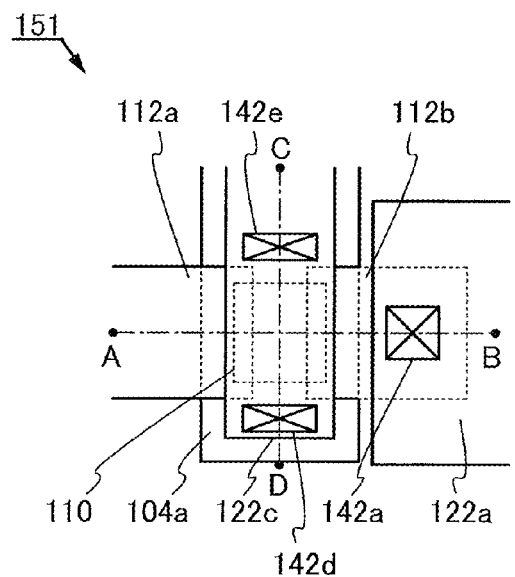
FIGS. 11A to 11C are a top view and cross-sectional views illustrating one embodiment of a semiconductor device.
Figure 11C:
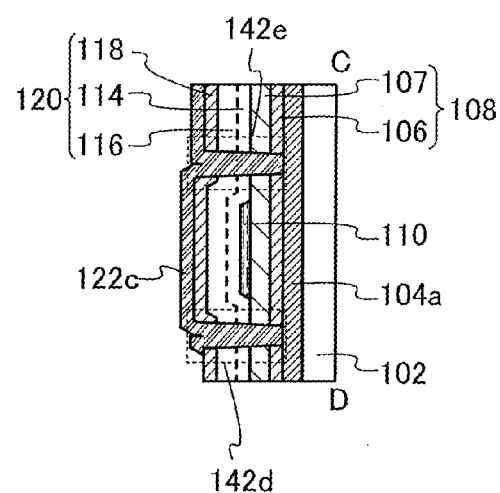
Figure 11B:
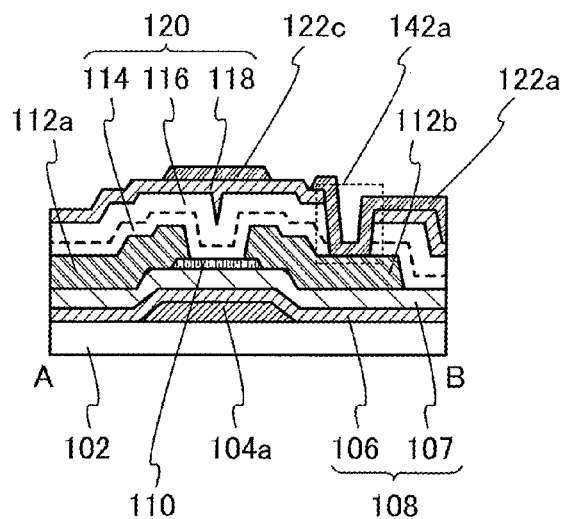

FIGS. 11A to 11C are a top view and cross-sectional views of a transistor 151 included in a semiconductor device. FIG. 11A is a top view of the transistor 151, FIG. 11B is a cross-sectional view taken along dashed-dotted line A-B in FIG. 11A, and FIG. 11C is a cross-sectional view taken along dashed-dotted line C-D in FIG. 11A. Note that in FIG. 11A, some components are not illustrated for clarity.

The transistor 151 illustrated in FIGS. 11B and 11C is a channel-etched transistor and includes the gate electrode 104a provided over the substrate 102, the first insulating film 108 that includes the insulating films 106 and 107 and is formed over the substrate 102 and the gate electrode 104a, the oxide semiconductor film 110 overlapping with the gate electrode 104a with the first insulating film 108 provided therebetween, and the source electrode 112a and the drain electrode 112b in contact with the oxide semiconductor film 110. In addition, over the first insulating film 108, the oxide semiconductor film 110, the source electrode 112a, and the drain electrode 112b, the second insulating film 120 including the insulating films 114, 116, and 118 and a gate electrode 122c formed over the second insulating film 120 are provided. The gate electrode 122c is connected to the gate electrode 104a in openings 142d and 142e provided in the first insulating film 108 and the second insulating film 120.

Note that the first insulating film 108 serves as a first gate insulating film of the transistor 151, and the second insulating film 120 serves as a second gate insulating film of the transistor 151. Furthermore, the conductive film 122a serves as a pixel electrode.

In the transistor 151 of one embodiment of the present invention, the oxide semiconductor film 110 is provided between the gate electrode 104a and the gate electrode 122c with the first insulating film 108 provided between the gate electrode 104a and the oxide semiconductor film 110 and with the second insulating film 120 provided between the gate electrode 122c and the oxide semiconductor film 110. In addition, as illustrated in FIG. 11A, the gate electrode 104a overlaps with side surfaces of the oxide semiconductor film 110 with the first insulating film 108 provided therebetween, when seen from the above.

A plurality of openings is provided in the first insulating film 108 and the second insulating film 120. Typically, as illustrated in FIG. 11B, an opening 142a through which part of the drain electrode 112b is exposed is provided. Furthermore, in the channel width direction, the openings 142d and 142e are provided with the oxide semiconductor film 110 provided therebetween as illustrated in FIG. 11C. In other words, the openings 142d and 142e are provided on outer sides of the side surfaces of the oxide semiconductor film 110. In the opening 142a, the drain electrode 112b is connected to the conductive film 122a. In addition, in the openings 142d and 142e, the gate electrode 104a is connected to the gate electrode 122c. This means that the gate electrode 104a and the gate electrode 122c surround the oxide semiconductor film 110 in the channel width direction with the first insulating film 108 and the second insulating film 120 provided between the oxide semiconductor film 110 and each of the gate electrode 104a and the gate electrode 122c. Furthermore, the gate electrode 122c on the side surfaces of the openings 142d and 142e faces the side surfaces of the oxide semiconductor film 110.

The gate electrode 104a and the gate electrode 122c are included, the same potential is applied to the gate electrode 104a and the gate electrode 122c, the side surface of the oxide semiconductor film 110 faces the gate electrode 122c, and the gate electrode 104a and the gate electrode 122c surround the oxide semiconductor film 110 in the channel width direction with the first insulating film 108 and the second insulating film 120 provided between the oxide semiconductor film 110 and each of the gate electrode 104a and the gate electrode 122c; thus, carriers flow not only at the interfaces between the oxide semiconductor film 110 and each of the first insulating film 108 and the second insulating film 120 but also in a wide region in the oxide semiconductor film 110, which results in an increase in the amount of carriers that move in the transistor 151.

As a result, the on-state current of the transistor 151 is increased, and the field-effect mobility is increased to greater than or equal to 10 cm$^2$/V·s or to greater than or equal to 20 cm$^2$V·s, for example. Note that here, the field-effect mobility is not an approximate value of the mobility as the physical property of the oxide semiconductor film but is an index of current drive capability and the apparent field-effect mobility of a saturation region of the transistor. Note that an increase in field-effect mobility becomes significant when the channel length (also referred to as L length) of the transistor is longer than or equal to 0.5 μm and shorter than or equal to 6.5 μm, preferably longer than 1 μm and shorter than 6 μm, further preferably longer than 1 μm and shorter than or equal to 4 μm, still further preferably longer than 1 μm and shorter than or equal to 3.5 μm, yet still further preferably longer than 1 μm and shorter than or equal to 2.5 μm. Furthermore, with a short channel length longer than or equal to 0.5 μm and shorter than or equal to 6.5 μm, the channel width can also be short.

Thus, even if a plurality of regions to be connection portions between the gate electrode 104a and the gate electrode 122c is provided, the area of the transistor 151 can be reduced.

Defects are formed at the end portion of the oxide semiconductor film 110, which is processed by etching or the like, because of damage due to the processing, and the end portion is polluted by attachment of impurities or the like. For this reason, in the case where only one of the gate electrode 104a and the gate electrode 122c is formed in the transistor 151, even when the oxide semiconductor film 110 is intrinsic or substantially intrinsic, the end portion of the oxide semiconductor film 110 are easily activated to be an n-type region (a low-resistance region) by application of stress such as an electric field.

In the case where the n-type end portions overlap with regions between the source electrode 112a and the drain electrode 112b, then-type regions serve as carrier paths, resulting in formation of a parasitic channel. As a result, drain current with respect to the threshold voltage is gradually increased, so that the threshold voltage of the transistor shifts in the negative direction. However, as illustrated in FIG. 11C, the gate electrode 104a and the gate electrode 122c having the same potentials are included and the gate electrode 122c faces the side surfaces of the oxide semiconductor film 110 in the channel width direction at the side surfaces of the second insulating film 120, whereby an electric field from the gate electrode 122c affects the oxide semiconductor film 110 also from the side surfaces of the oxide semiconductor film 110. As a result, a parasitic channel is prevented from being generated at the side surface of the oxide semiconductor film 110 or the end portion including the side surface and its vicinity. Thus, the transistor having favorable electrical characteristics of a sharp increase in drain current with respect to the threshold voltage is obtained.

By including the gate electrode 104a and the gate electrode 122c, each of which has a function of blocking an external electric field; thus, charges such as a charged particle between the substrate 102 and the gate electrode 104a and over the gate electrode 122c do not affect the oxide semiconductor film 110. Thus, degradation due to a stress test (e.g., a negative gate bias temperature (−GBT) stress test in which a negative potential is applied to a gate electrode) can be reduced, and changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in the threshold voltage of the transistor between before and after the BT stress test is an important indicator when examining the reliability of the transistor. As the amount of change in the threshold voltage between before and after the BT stress test is small, the transistor has higher reliability.

A method for manufacturing the transistor 151 is described below.

The openings 142d and 142e in FIGS. 11B and 11C can be formed in the same step as the opening 142a, that is, can be formed at the same time as the opening 142a. The gate electrode 122c can be formed in the same step as the conductive film 122a serving as a pixel electrode, that is, can be formed at the same time as the conductive film 122a.

Formation steps other than the steps of forming the openings 142d and 142e and the gate electrode 122c are similar to those of the transistor 150 in Embodiment 1; thus, the formation steps are not described here.

Through the above steps, a semiconductor device which includes a transistor having an oxide semiconductor film can have favorable electrical characteristics. Furthermore, the semiconductor device which includes the transistor having the oxide semiconductor film can have high reliability.

Note that the structures, methods, and the like described in this embodiment can be used as appropriate in combination with any of the structures, methods, and the like described in the other embodiments.

(Embodiment 5)

In this embodiment, an example of an oxide semiconductor film that can be used in the transistor 150 in Embodiment 1 is described.

<Crystallinity of Oxide Semiconductor Film>

A structure of an oxide semiconductor film is described below.

An oxide semiconductor film is classified roughly into a non-single-crystal oxide semiconductor film and a single crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to a TEM image of the CAAC-OS film observed in a direction substantially parallel to a sample surface (cross-sectional TEM image), metal atoms are arranged in a layered manner in the crystal parts. Each metal atom layer has a morphology reflected by a surface where the CAAC-OS film is formed (hereinafter, a surface where the CAAC-OS film is formed is also referred to as a formation surface) or a top surface of the CAAC-OS film, and is arranged in parallel to the formation surface or the top surface of the CAAC-OS film.

Note that in this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

On the other hand, according to a TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM age, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (ϕ scan) is performed under conditions where the sample is rotated around a normal vector of a sample surface as an axis (ϕ axis) with 2θ fixed at around 56°. In the case where the sample is a single crystal oxide semiconductor film of $InGaZnO_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In this specification, the trigonal and rhombohedral crystal systems are included in the hexagonal crystal system.

The CAAC-OS film is an oxide semiconductor film with a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film night serve as a carrier trap or a carrier generation source.

The CAAC-OS film is an oxide semiconductor film having a low density of defect states.

With use of the CAAC-OS film in a transistor, a variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a boundary is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has aperiodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the size of a crystal part. Meanwhile, spots are observed in an electron diffraction pattern of the nc-OS film obtained by using an electron beam having a probe diameter (e.g., larger than or equal to 1 nm and smaller than or equal to 30 nm) close to or smaller than the size of a crystal part. Further, in a nanobeam electron diffraction pattern of the nc-OS film, for example, bright regions in a circular (or ring-shaped) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

<Method for Forming CAAC-OS Film>

For example, a CAAC-OS film is deposited by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like or pellet-like sputtered particle reaches a substrate while maintaining its crystal state, whereby the CAAC-OS film can be formed.

The flat-plate-like or pellet-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm. Note that in the flat-plate-like or pellet-like sputtered particle, the plane parallel to the a-b plane may be a regular triangle or a regular hexagon Here, the term "equivalent circle diameter of a plane" refers to the diameter of a perfect circle having the same area as the plane.

For the deposition of the CAAC-OS film, the following conditions are preferably used.

By increasing the substrate temperature during the deposition, migration of a sputtered particle is likely to occur after the sputtered particle reaches a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like or pellet-like sputtered particle reaches the substrate, migration occurs on the substrate surface, so that a flat plane of the sputtered particle is attached to the substrate. At this time, the sputtered particles are positively charged, thereby being attached to the substrate while repelling each other; thus, the sputtered particles are not stacked unevenly, so that a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed an that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film in a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film in a shorter time.

The first oxide semiconductor film with a thickness of greater than or equal to 1 nm and less than 10 nm can be easily crystallized by heat treatment as compared to the case where the first oxide semiconductor film has a thickness of greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film from the first CAAC-OS film occurs, whereby the second oxide semiconductor film is turned into a second CAAC-OS film having high crystallinity. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film in a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film in a shorter time.

In the above-described manner, a CAAC-OS film having a total thickness of 10 nm or more can be formed. The CAAC-OS film can be favorably used as the oxide semiconductor film in an oxide stack.

Next, a method for forming an oxide film in the case where a formation surface has a low temperature (e.g., a temperature lower than 130° C., lower than 100° C., or lower than 70° C., or about a room temperature (20° C. to 25° C.)) because, for example, the substrate is not heated is described.

In the case where the formation surface has a low temperature, sputtered particles fall irregularly to the formation surface. For example, migration does not occur; therefore, the sputtered particles are randomly deposited on the formation surface including a region where other sputtered particles have been deposited. That is, an oxide film obtained by the deposition might have a non-uniform thickness and a disordered crystal alignment. The oxide film obtained in the above manner maintains the crystallinity of the sputtered particles to a certain degree and thus has a crystal part (nanocrystal).

For example, in the case where the pressure at the deposition is high, the frequency with which the flying sputtered particle collides with another particle (e.g., an atom, a molecule, an ion, or a radical) of argon or the like is increased. When the flying sputtered particle collides with another particle (or is resputtered), the crystal structure of the sputtered particle might be broken. For example, when the sputtered particle collides with another particle, the flat-plate-like or pellet-like shape of the sputtered particle cannot be kept, and the sputtered particle might be broken into parts (e.g., atomized). At this time, when atoms obtained from the sputtered particle are deposited on the formation surface, an amorphous oxide semiconductor film might be formed.

In the case where not a sputtering method using a target including polycrystalline oxide but a deposition method using liquid or a method for depositing a film by vaporizing a solid such as a target is used, the atoms separately fly and are deposited to the formation surface; therefore, an amorphous oxide film might be formed. Further, for example, by a laser ablation method, atoms, molecules, ions, radials, clusters, or the like released from the target fly and are deposited to the formation surface; therefore, an amorphous oxide film might be formed.

An oxide semiconductor film included in a resistor and a transistor in one embodiment of the present invention may have any of the above crystal states. Further, in the case of stacked oxide semiconductor films, the crystal states of the oxide semiconductor films may be different from each other. Note that a CAAC-OS film is preferably applied to the oxide semiconductor film functioning as a channel of the transistor. Further, the oxide semiconductor film included in the resistor has a higher impurity concentration than that of the oxide semiconductor film included in the transistor; thus, the crystallinity is lowered in some cases.

The structures, methods, and the like described in this embodiment can be used as appropriate in combination with any of the structures, methods, and the like described in the other embodiments.

(Embodiment 6)

In this embodiment, an example in which a semiconductor device of one embodiment of the present invention is used in a display device will be described with reference to drawings. Note that portions similar to those in the above embodiments and portions having functions similar to those in the above embodiments are given the same reference numerals, and detailed descriptions thereof are omitted.

Figure 12A:
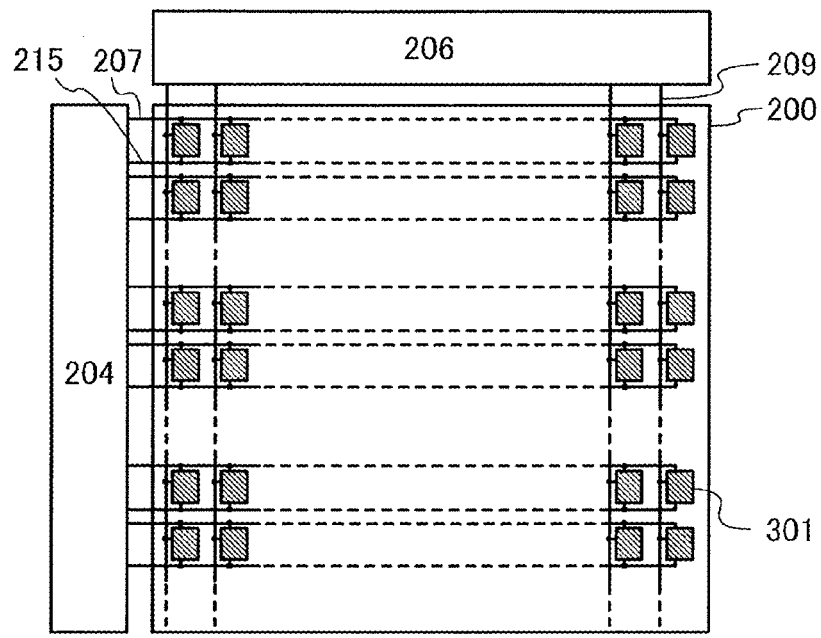
FIGS. 12A and 12B are a block diagram and a circuit diagram illustrating one embodiment of a display device.

FIG. 12A illustrates an example of a display device. The display device in FIG. 12A includes a pixel portion 200, a scan line driver circuit 204, a signal line driver circuit 206, m scan lines 207 that are arranged in parallel or substantially in parallel and whose potentials are controlled by the scan line driver circuit 204, and n signal lines 209 that are arranged in parallel or substantially in parallel and whose potentials are controlled by the signal line driver circuit 206. The pixel portion 200 includes a plurality of pixels 301 arranged in a matrix. Capacitor lines 215 that are arranged in parallel or substantially in parallel to the scan lines 207 are also provided. The capacitor lines 215 may be arranged in parallel or substantially in parallel to the signal lines 209. The scan line driver circuit 204 and the signal line driver circuit 206 may be collectively referred to as a driver circuit portion.

Each scan line 207 is electrically connected to the n pixels 301 in the corresponding row among the pixels 202 arranged in m rows and n columns in the pixel portion 200. Each signal line 209 is electrically connected to the m pixels 301 in the corresponding column among the pixels 301 arranged in m rows and n columns. Note that m and n are each an integer of 1 or more. Each capacitor line 215 is electrically connected to the n pixels 301 in the corresponding row among the pixels 301 arranged in m rows and n columns. Note that in the case where the capacitor lines 215 are arranged in parallel or substantially in parallel along the signal lines 209, each capacitor line 215 is electrically connected to the m pixels 301 in the corresponding column among the pixels 301 arranged in m rows and n columns.

The semiconductor device described in Embodiment 1 can be used in the pixel 301, the scan line driver circuit 204, and the signal line driver circuit 206 in FIG. 12A. In particular, a connection portion between the scan line driver circuit 204 and the signal line driver circuit 206 preferably has a structure including the connection portion 160 in Embodiment 1. Furthermore, the pixel 301 preferably includes the transistor 150 and the capacitor 170 in Embodiment 2.

Figure 12B:
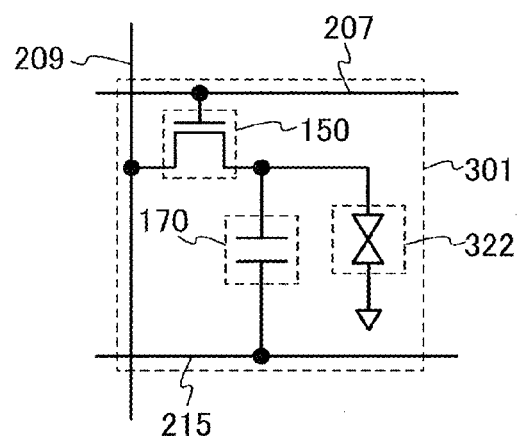

FIG. 12B illustrates a circuit configuration that can be used for the pixels 301 in the display device illustrated in FIG. 12A.

The pixel 301 illustrated in FIG. 12B includes the liquid crystal element 322, the transistor 150, and the capacitor 170.

The potential of one of a pair of electrodes of the liquid crystal element 322 is set in accordance with the specifications of the pixel 301 as appropriate. The alignment state of the liquid crystal element 322 depends on written data. A common potential may be supplied to one of the pair of electrodes of the liquid crystal element 322 included in each of the plurality of pixels 301. The potential supplied to one of a pair of electrodes of the liquid crystal element 322 in each of the pixels 301 in one row may be different from the potential supplied to one of a pair of electrodes of the liquid crystal element 322 in each of the pixels 301 in another row.

The liquid crystal element 322 is an element that controls transmission and non-transmission of light by the optical modulation action of liquid crystal. Note that the optical modulation action of a liquid crystal is controlled by an electric field applied to the liquid crystal (including a horizontal electric field, a vertical electric field, and an oblique electric field). Note that any of the following can be used for the liquid crystal element 322: nematic liquid crystal, cholesteric liquid crystal, smectic liquid crystal, discotic liquid crystal, thermotropic liquid crystal, lyotropic liquid crystal, lyotropic liquid crystal, low-molecular liquid crystal, high-molecular liquid crystal, ferroelectric liquid crystal, anti-ferroelectric liquid crystal, main-chain liquid crystal, side-chain high-molecular liquid crystal, a banana-shaped liquid crystal, and the like.

Examples of a driving method of the display device including the liquid crystal element 322 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to them, and any of various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less, and is optically isotropic, which makes the alignment process unneeded and the viewing angle dependence small.

In the pixel 301 illustrated in FIG. 12B, one of a source electrode and a drain electrode of the transistor 150 is electrically connected to the signal line 209, and the other is electrically connected to the other of a pair of electrodes of the liquid crystal element 322. A gate electrode of the transistor 150 is electrically connected to the scan line 207. The transistor 150 has a function of controlling whether to write a data signal by being turned on or off.

In the structure of the pixel 301 illustrated in FIG. 12B, one of a pair of electrodes of the capacitor 170 is electrically connected to the capacitor line 215 to which a potential is supplied, and the other is electrically connected to the other of the pair of electrodes of the liquid crystal element 322. The potential of the capacitor line 215 is set in accordance with the specifications of the pixel 301 as appropriate. The capacitor 170 serves as a storage capacitor for storing written data.

For example, in the display device including the pixel 301 in FIG. 12B, the pixels 301 are sequentially selected row by row by the scan line driver circuit 204, whereby the transistors 150 are turned on and data of a data signal is written.

When the transistors 150 are turned off, the pixels 301 to which the data has been written are brought into a holding state. This operation is performed row by row sequentially; thus, an image can be displayed.

The structures, methods, and the like described in this embodiment can be used as appropriate in combination with any of the structures, methods, and the like described in the other embodiments.

(Embodiment 7)

In this embodiment, a display module and electronic devices that can be formed using a semiconductor device of one embodiment of the present invention are described with reference to FIG. 13 and FIGS. 14A to 14H.

In a display module 8000 illustrated in FIG. 13, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate sealing substrate) of the display panel 8006 can have a touch panel function. A photosensor may be provided in each pixel of the display panel 8006 to form an optical touch panel.

The backlight 8007 includes a light source 8008. The light source 8008 may be provided at an end portion of the backlight 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 14A to 14H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 14A:
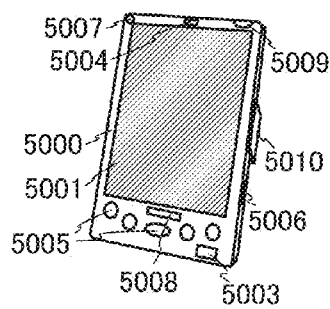
FIGS. 14A to 14H illustrate electronic appliances.
Figure 14B:
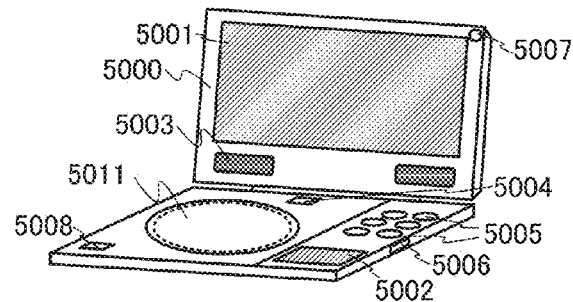
Figure 14C:
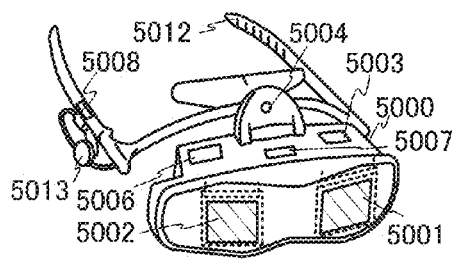
Figure 14D:
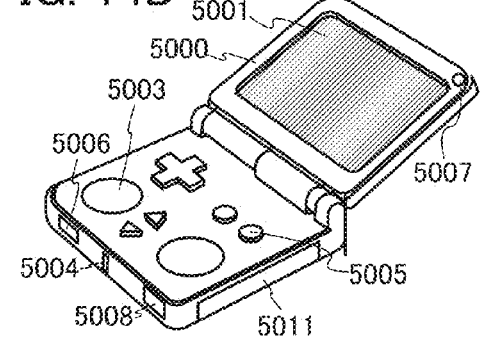
Figure 14E:
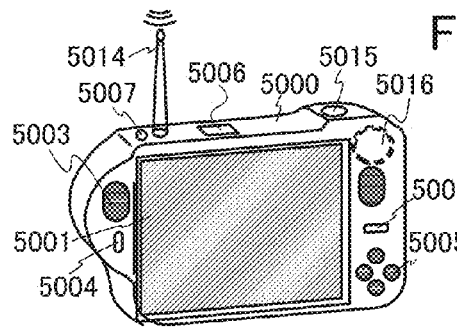
Figure 14F:
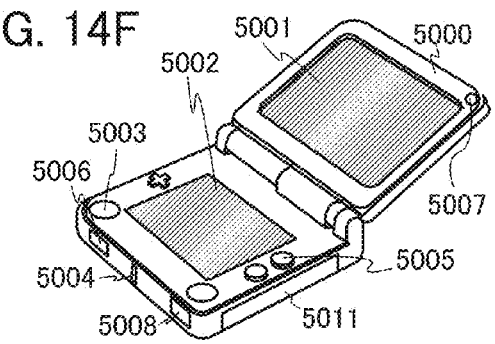
Figure 14G:
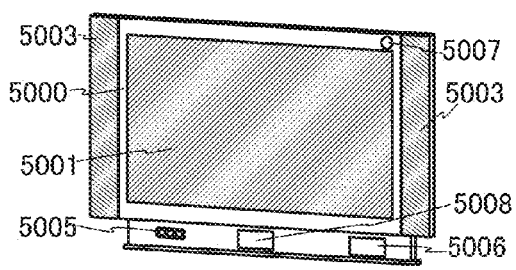
Figure 14H:
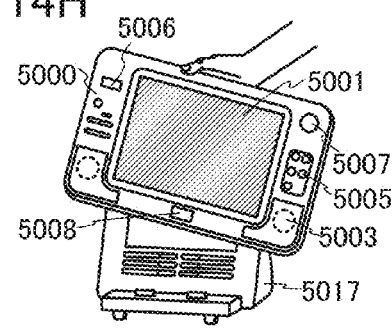

FIG. 14A illustrates a mobile computer that can include a switch 5009, an infrared port 5010, and the like in addition to the above components. FIG. 14B illustrates a portable image reproducing device (e.g., a DVD player) that is provided with a memory medium and can include a second display portion 5002, a memory medium reading portion 5011, and the like in addition to the above components. FIG. 14C illustrates a goggle-type display that can include the second display portion 5002, a support 5012, an earphone 5013, and the like in addition to the above components. FIG. 14D illustrates a portable game machine that can include the memory medium reading portion 5011 and the like in addition to the above components. FIG. 14E illustrates a digital camera that has a television reception function and can include an antenna 5014, a shutter button 5015, an image receiving portion 5016, and the like in addition to the above components. FIG. 14F illustrates a portable game machine that can include the second display portion 5002, the memory medium reading portion 5011, and the like in addition to the above components. FIG. 14G illustrates a television receiver that can include a tuner, an image processing portion, and the like in addition to the above components. FIG. 14H illustrates a portable television receiver that can include a charger 5017 capable of transmitting and receiving signals, and the like in addition to the above components.

The electronic devices illustrated in FIGS. 14A to 14H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Further, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera, a function of displaying a shot image on the display portion, or the like. Note that functions that can be provided for the electronic devices illustrated in FIGS. 14A to 14H are not limited to those described above, and the electronic devices can have a variety of functions.

The structures described in this embodiment can be used as appropriate in combination with any of the structures described in the other embodiments.

EXAMPLE

In this example, as a semiconductor device of one embodiment of the present invention. Sample 1 was manufactured and the cross section was evaluated. In addition, as a comparative semiconductor device, Sample 2 was manufactured and the cross section was observed. First, Sample 1 and Sample 2 are described below.

Figure 19A:
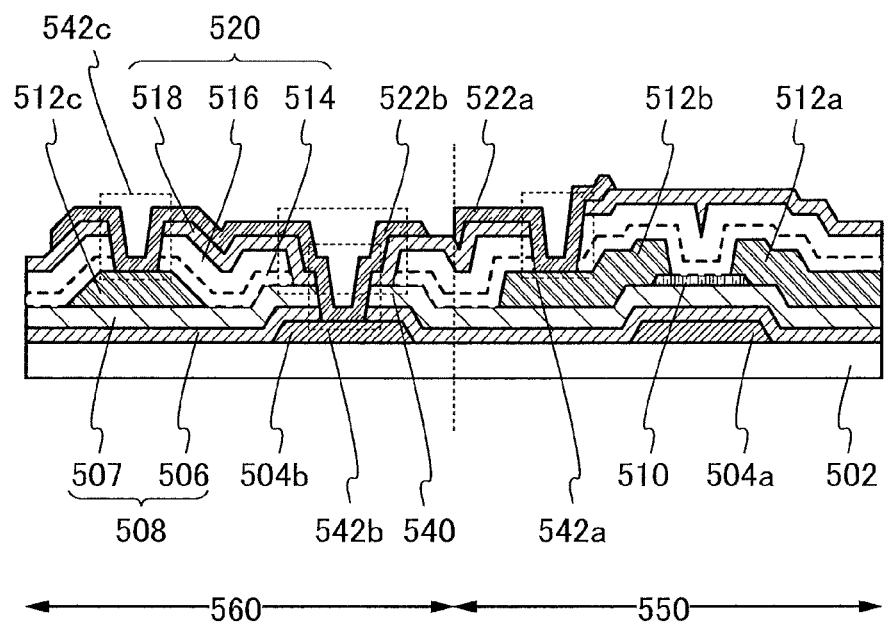
FIGS. 19A and 19B are cross-sectional views each illustrating a structure of a sample in Example.
Figure 19B:
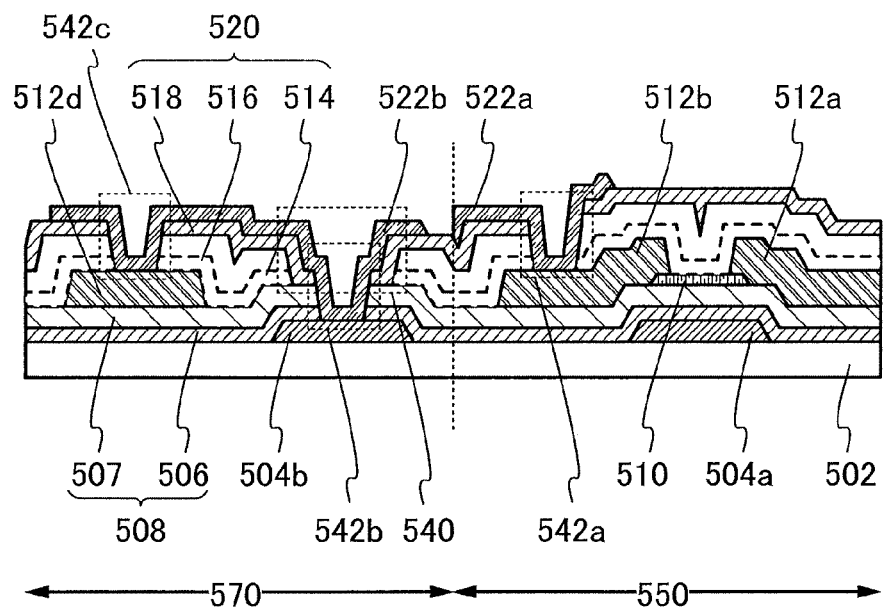

The cross-sectional views of Sample 1 and Sample 2 are illustrated in FIG. 19A and FIG. 19B, respectively.
(Sample 1)

A semiconductor device in FIG. 19A includes a transistor 550 and a connection portion 560.

The transistor 550 includes agate electrode 504*a* over a substrate 502, a first insulating film 508 formed over the gate electrode 504*a*, an oxide semiconductor film 510 formed in a position over the first insulating film 508 and overlapping with the gate electrode 504*a*, and a source electrode 512*a* and a drain electrode 512*b* that are electrically connected to the oxide semiconductor film 510.

The first insulating film 508 was formed to include an insulating film 506 and an insulating film 507.

In addition, over the transistor 550, specifically over the oxide semiconductor film 510, the source electrode 512*a*, and the drain electrode 512*b*, a second insulating film 520 was formed. The second insulating film 520 has a three-layer structure of insulating films 514, 516, and 518.

Moreover, an opening 542*a* reaching the drain electrode 512*b* was formed in the second insulating film 520. In addition, a conductive film 522*a* serving as a pixel electrode was formed over the second insulating film 520 to cover the opening 542*a*. The conductive film 522*a* is connected to the drain electrode 512*b* of the transistor 550.

The connection portion 560 includes a first wiring 504*b* over the substrate 502, the first insulating film 508 over the first wiring 504*b*, an opening 542*b* provided in the first insulating film 508, a second wiring 512*c* over the first insulating film 508, the second insulating film 520 over the second wiring 512*c*, an opening 540 provided in the second insulating film 520, and a conductive film 522*b* serving as a third wiring that is formed to cover the openings 542*b* and 540 and connects the first wiring 504*b* and the second wiring 512*c*.

Note that the first wiring 504*b* was formed in the same steps as the gate electrode 504*a* of the transistor 550. Moreover, the second wiring 512*c* was formed in the same steps as the source electrode 512*a* and the drain electrode 512*b* of the transistor 550.

(Sample 2)

A semiconductor device in FIG. 19B includes a transistor 550 and a connection portion 570.

The transistor 550 had a structure similar to that of the transistor 550 in Sample 1.

The connection portion 570 includes a first wiring 504b over the substrate 502, the first insulating film 508 over the first wiring 504b, an opening 542b provided in the first insulating film 508, a second wiring 512d over the first insulating film 508, the second insulating film 520 over the second wiring 512d, an opening 540 provided in the second insulating film 520, and a conductive film 522b serving as a third wiring that is formed to cover the openings 542b and 540 and connects the first wiring 504b and the second wiring 512d.

Differences between the semiconductor device in FIG. 19A (Sample 1) and the semiconductor device in FIG. 19B (Sample 2) are the formation method and the cross-sectional shape of the second wiring 512c and the second wiring 512d. Methods for manufacturing Sample 1 and Sample 2 are described below. Note that the manufacturing methods of Sample 1 and Sample 2 are the same except for the manufacturing methods of the second wiring 512c and the second wiring 512d; thus, the common manufacturing methods are described once, and the description is not repeated.

(Method for Manufacturing Sample 1)

First, the substrate 502 was prepared. A glass substrate was used as the substrate 502. Then, a conductive film to be the gate electrode 504a and the first wiring 504b was formed over the substrate 502. A 200-nm-thick tungsten film W was formed by a sputtering method as the conductive film. After that, a first patterning step and an etching step were performed, whereby the gate electrode 504a and the first wiring 504b were formed.

Then, the insulating films 506 and 507 were formed over the substrate 502, the gate electrode 504a, and the first wiring 504b. A 400-nm-thick silicon nitride film was formed as the insulating film 506. A 50-nm-thick silicon oxynitride film SiON(1) was formed as the insulating film 507. Note that the silicon nitride film was formed to have a three-layer structure of a first silicon nitride film SiN(1), a second silicon nitride film SiN(2), and a third silicon nitride film SiN(3). The first silicon nitride film SiN(1) was formed to have a thickness of 50 nm under the following conditions: silane at a flow rate of 200 sccm, nitrogen at a flow rate of 2000 sccm, and an ammonia gas at a flow rate of 100 sccm were supplied to a reaction chamber of a plasma CVD apparatus as a source gas the pressure in the reaction chamber was controlled to 100 Pa, and power of 2000 W was supplied with the use of a 27.12 MHz high-frequency power source. The second silicon nitride film SiN(2) was formed to have a thickness of 300 nm under the following conditions: silane at a flow rate of 200 sccm, nitrogen at a flow rate of 2000 sccm, and an ammonia gas at a flow rate of 2000 sccm were supplied to the reaction chamber of the plasma CVD apparatus as a source gas; the pressure in the reaction chamber was controlled to 100 Pa, and power of 2000 W was supplied with the use of a 27.12 MHz high-frequency power source. The third silicon nitride film SiN(3) was formed to have a thickness of 50 nm under the following conditions: silane at a flow rate of 200 sccm and nitrogen at a flow rate of 5000 sccm were supplied to the reaction chamber of the plasma CVD apparatus as a source gas; the pressure in the reaction chamber was controlled to 100 Pa, and power of 2000 W was supplied with the use of a 27.12 MHz high-frequency power source. The substrate temperature during the formation of the first silicon nitride film SiN(1), the second silicon nitride film SiN(2), and the third silicon nitride film SiN(3) was set to 350° C.

The silicon oxynitride film SiON(1) used as the insulating film 507 was formed under the following conditions: silane with a flow rate of 20 sccm and dinitrogen monoxide with a flow rate of 3000 sccm were supplied to a reaction chamber of a plasma CVD apparatus as a source gas; the pressure in the reaction chamber was adjusted to 40 Pa; and a power of 100 W was supplied with the use of a 27.12 MHz high-frequency power source. The substrate temperature during the formation of the silicon oxynitride film SiON(1) was set to 350° C.

Next, the oxide semiconductor film 510 was formed in a position overlapping with the gate electrode 504a with the insulating films 506 and 507 provided therebetween. Here, a 35-nm-thick oxide semiconductor film was formed over the insulating film 507 by a sputtering method. The shape of the oxide semiconductor film 510 was formed by a second patterning step and an etching step.

The oxide semiconductor film was formed under the following conditions: a sputtering target of In:Ga:Zn=1:1:1 (atomic ratio) was used; oxygen with a flow rate of 100 sccm and argon with a flow rate of 100 sccm were supplied as a sputtering gas into a reaction chamber of a sputtering apparatus; the pressure in the reaction chamber was adjusted to 0.6 Pa; and an alternating-current power of 2.5 kW was supplied. The substrate temperature during the formation of the oxide semiconductor film was set to 170° C.

Next, the source electrode 512a and the drain electrode 512b were formed in contact with the oxide semiconductor film 510. The second wiring 512c was formed over the insulating film 507. The shapes of the source electrode 512a, the drain electrode 512b, and the second wiring 512c were formed by a third patterning step and an etching step. In the third patterning step, the source electrode 512a and the drain electrode 512b were formed with the use of resist masks whose shapes were similar to those of the resist masks 148a and 148b in FIG. 4D. The second wiring 512c was formed with the use of a resist mask whose shape was similar to that of the resist mask 148c in FIG. 4D. As the resist mask in a region of the second wiring 512c, a gray tone mask was used.

As the source electrode 512a, the drain electrode 512b, and the second wiring 512c, a 400-nm-thick aluminum film Al was formed over a 50-nm-thick tungsten film W, and a 200-nm-thick titanium film Ti was formed over the aluminum film Al. Note that the tungsten film W, the aluminum film Al, and the titanium film Ti each were formed by a sputtering method.

Next, after the substrate was transferred to a reaction chamber in a reduced pressure and heated at 350° C., the oxide semiconductor film 510 was exposed to oxygen plasma that was generated in a dinitrogen monoxide atmosphere by supply of a high-frequency power of 150 W to an upper electrode provided in the reaction chamber with the use of a 27.12 MHz high-frequency power source.

Next, the insulating films 514 and 516 were formed to cover the oxide semiconductor film 510, the source electrode 512a, the drain electrode 512b, and the second wiring 512c. As the insulating film 514, a first oxide insulating film was formed. As the insulating film 516, a second oxide insulating film was formed.

First, after the above oxygen plasma treatment, the first oxide insulating film and the second oxide insulating film were formed in succession without exposure to the air. A 50-nm-thick silicon oxynitride film SiON(2) was formed as the first oxide insulating film, and a 400-nm-thick silicon oxynitride film SiON(3) was formed as the second oxide insulating film. The silicon oxynitride film SiON(2) and the silicon oxynitride film SiON(3) were formed using deposition gases of the same kind; thus, in the cross section, the interface between these films cannot be clearly defined in some cases.

The first oxide insulating film was formed by a plasma CVD method under the following conditions: silane with a flow rate of 20 sccm and dinitrogen monoxide with a flow rate of 3000 sccm were used as a source gas; the pressure in the reaction chamber was 200 Pa; the substrate temperature was 350° C.; and a high-frequency power of 100 W was supplied to parallel-plate electrodes.

The second oxide insulating film was formed by a plasma CVD method under the following conditions: silane with a flow rate of 160 sccm and dinitrogen monoxide with a flow rate of 4000 sccm were used as a source gas; the pressure in the reaction chamber was 200 Pa; the substrate temperature was 220° C.; and a high-frequency power of 1500 W was supplied to parallel-plate electrodes. Under the above conditions, it is possible to form a silicon oxynitride film containing oxygen at a higher proportion than oxygen in the stoichiometric composition and from which part of oxygen is released by heating.

Next, by heat treatment, water, nitrogen, hydrogen, and the like were released from the first oxide insulating film and the second oxide insulating film and part of oxygen contained in the second oxide insulating film was supplied to the oxide semiconductor film 510. Here, the heat treatment was performed at 350° C. in a mixed atmosphere of nitrogen and oxygen for one hour.

Next, the opening 540 was formed in desired regions of the insulating films 514 and 516. The shape of the opening 540 was formed by a fourth patterning step and an etching step. Furthermore, the opening 540 was formed by a dry etching method.

Then, over the insulating film 516, the insulating film 518 was formed to cover the opening 540. A 100-nm-thick nitride insulating film was formed as the insulating film 518. The nitride insulating film was formed by a plasma CVD method under the following conditions: silane at a flow rate of 50 sccm, nitrogen at a flow rate of 5000 sccm, and an ammonia gas at a flow rate of 100 sccm were used as a source gas, the pressure in the reaction chamber was 100 Pa, the substrate temperature was 350° C., and high-frequency power of 1000 W was supplied to the parallel-plate electrodes.

Next, the opening 542a reaching the drain electrode 512b was formed in the insulating films 514, 516, and 518, the opening 542b reaching the first wiring 504b was formed in the insulating films 506 and 507, and an opening 542c reaching the second wiring 512c was formed in the insulating films 514, 516, and 518, at the same time. The shapes of the openings 542a, 542b, and 542c were formed by a fifth patterning step and an etching step. Furthermore, the openings 542a, 542b, and 542c were formed by a dry etching method.

Then, over the insulating film 518, the conductive film 522a was formed to cover the opening 542a. Furthermore, over the insulating film 518, the conductive film 522b serving as a third wiring was formed to cover the openings 542b and 542c. Note that the shapes of the conductive films 522a and 522b were formed by a sixth patterning step and an etching step.

As the conductive films 522a and 522b, a 100-nm-thick conductive film of an indium oxide-tin oxide compound containing silicon oxide (ITO-SiO$_2$, hereinafter referred to as ITSO) was formed by a sputtering method. Note that the composition of a target used for forming the conductive film was In$_2$O$_3$:SnO$_2$:SiO$_2$=85:10:5 [wt %]. Furthermore, the conductive films 522a and 522b were formed by a wet etching method.

Through the above steps, Sample 1 of one embodiment of the present invention was manufactured.

(Method for Manufacturing Sample 2)

The method for manufacturing Sample 2 is different from the method for manufacturing Sample 1 in only the following point.

After the oxide semiconductor film 510 was formed, the source electrode 512a and the drain electrode 512b that were in contact with the oxide semiconductor film 510 were formed. In addition, the second wiring 512d was formed over the insulating film 507. Note that the shapes of the source electrode 512a, the drain electrode 512b, and the second wiring 512d were formed by the third patterning step and the etching step. Furthermore, the source electrode 512a, the drain electrode 512b, and the second wiring 512d were formed using a normal mask.

Through the above steps, Sample 2 for comparison was manufactured.

Figure 20A:
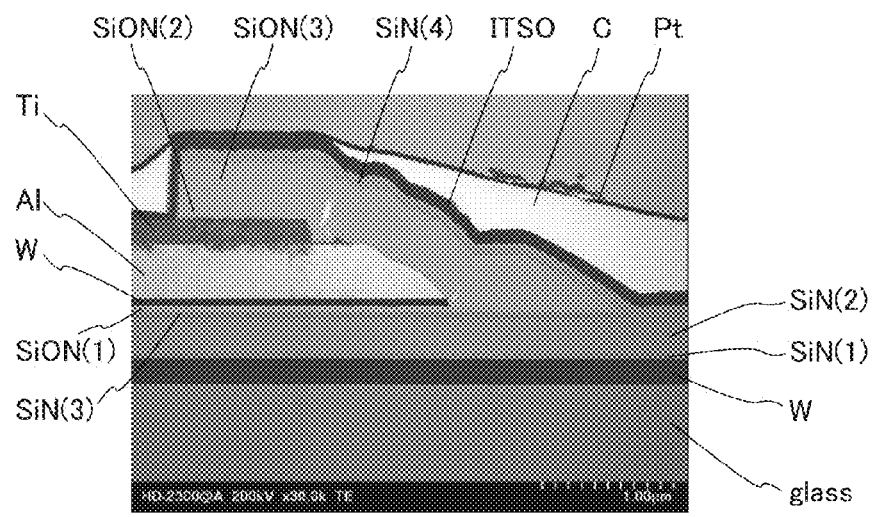
FIGS. 20A and 20B each show results of observation by STEM in Example.
Figure 20B:
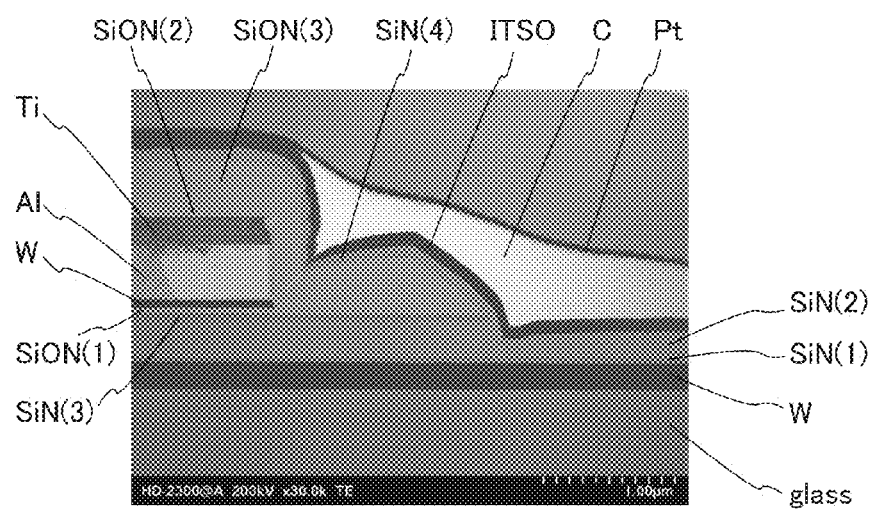

FIGS. 20A and 20B show cross-sectional observation results of Sample 1 and Sample 2.

In this example, the cross section of the connection portion 560 in FIG. 20A and the cross section of the connection portion 570 in FIG. 20B were observed. Note that the cross-sectional observation results in FIGS. 20A and 20B were obtained by scanning transmission electron microscopy (STEM). In FIGS. 20A and 20B, C represents carbon (C) coating used in observation by STEM and Pt represents platinum (Pt) coating used in observation by STEM.

As shown in FIG. 20A, taper angles of cross-sectional shapes of the tungsten film W, the aluminum film Al, and the titanium film Ti which were used as the second wiring 512c of Sample 1 are small. Note that in this Example, the taper angle refers to an angle formed by the top surface of SiON (1) and the side surface of the aluminum film Al or the titanium film Ti when the sample is seen from the direction perpendicular to the cross section (i.e., the plane perpendicular to the surface of the substrate). In addition, the titanium film Ti is provided on an inner side of the aluminum film Al. With such a cross-sectional shape of the second wiring 512c shown in FIG. 20A, the coverage of the second wiring 512c with films formed over the second wiring 512c, which are SiON(2), SiON(3), SiN(4), and ITSO in FIG. 20A, are favorable.

On the other hand, as shown in FIG. 20B, taper angles of cross-sectional shapes of the tungsten film W, the aluminum film Al, and the titanium film Ti which were used as the second wiring 512d of Sample 2 are larger than those of Sample 1. With such a cross-sectional shape of the second wiring 512d shown in FIG. 20B, the coverage of the second wiring 512c with films formed over the second wiring 512d, which are SiON(2), SiON(3), SiN(4), and ITSO in FIG. 20B, are poor. In particular, SiN(4) and ITSO covers regions having reversed tapered angles.

The structures described in this example can be used as appropriate in combination with any of the other embodiments.

This application is based on Japanese Patent Application serial no. 2013-144824 filed with Japan Patent Office on Jul. 10, 2013 and Japanese Patent Application serial no. 2013-

160047 filed with Japan Patent Office on Aug. 1, 2013, the entire contents of which are hereby incorporated by reference.

What is claimed is:

1. A display device comprising:
a gate electrode on an insulating surface;
a first wiring on the insulating surface;
a first insulating film over the gate electrode and the first wiring;
a semiconductor layer on the first insulating film, the semiconductor layer comprising a channel formation region over the gate electrode with the first insulating film interposed therebetween;
a source electrode over and in electrical contact with the semiconductor layer;
a drain electrode over and in electrical contact with the semiconductor layer;
a second wiring on the first insulating film;
a second insulating film over the source electrode, the drain electrode and the second wiring; and
a third wiring over the second insulating film,
wherein the third wiring contacts the first wiring through an opening of the first insulating film,
wherein the third wiring contacts the second wiring through an opening of the second insulating film, and
wherein the second wiring has a smaller taper angle than the source electrode and the drain electrode.

2. The display device according to claim 1, wherein the semiconductor layer comprises an oxide semiconductor material.

3. The display device according to claim 1, further comprising a pixel electrode over the second insulating film, the pixel electrode contacting the drain electrode.

4. The display device according to claim 1, wherein the third wiring comprises an oxide, the oxide comprising indium.

5. An electronic device comprising the display device according to claim 1, the electronic device comprising a touch panel adjacent to the display device.

6. A display device comprising:
a first gate electrode on an insulating surface;
a first wiring on the insulating surface;
a first insulating film over the first gate electrode and the first wiring;
a semiconductor layer on the first insulating film, the semiconductor layer comprising a channel formation region over the first gate electrode with the first insulating film interposed therebetween;
a source electrode over and in electrical contact with the semiconductor layer;
a drain electrode over and in electrical contact with the semiconductor layer;
a second wiring on the first insulating film;
a second insulating film over the source electrode, the drain electrode and the second wiring;
a third wiring over the second insulating film; and
a second gate electrode over the second insulating film, the second gate electrode overlapping with the semiconductor layer,
wherein the third wiring contacts the first wiring through an opening of the first insulating film,
wherein the third wiring contacts the second wiring through an opening of the second insulating film, and
wherein the second wiring has a smaller taper angle than the source electrode and the drain electrode.

7. The display device according to claim 6, wherein the semiconductor layer comprises an oxide semiconductor material.

8. The display device according to claim 6, further comprising a pixel electrode over the second insulating film, the pixel electrode contacting the drain electrode.

9. The display device according to claim 6, wherein the third wiring comprises an oxide, the oxide comprising indium.

10. An electronic device comprising the display device according to claim 6, the electronic device comprising a touch panel adjacent to the display device.

11. A display device comprising:
a first gate electrode on an insulating surface;
a first wiring on the insulating surface;
a first insulating film over the first gate electrode and the first wiring;
a semiconductor layer on the first insulating film, the semiconductor layer comprising a channel formation region over the first gate electrode with the first insulating film interposed therebetween;
a source electrode over and in electrical contact with the semiconductor layer;
a drain electrode over and in electrical contact with the semiconductor layer;
a second wiring on the first insulating film;
a second insulating film over the source electrode, the drain electrode and the second wiring;
a third wiring over the second insulating film; and
a second gate electrode over the second insulating film, the second gate electrode overlapping with the semiconductor layer,
wherein the third wiring contacts the first wiring through an opening of the first insulating film,
wherein the third wiring contacts the second wiring through an opening of the second insulating film,
wherein the second wiring has a smaller taper angle than the source electrode and the drain electrode,
wherein the second gate electrode comprises a first region and a second region that face each other in a channel width direction of the semiconductor layer, and
wherein the semiconductor layer is between the first region and the second region of the second gate electrode.

12. The display device according to claim 11, wherein the semiconductor layer comprises an oxide semiconductor material.

13. The display device according to claim 11, further comprising a pixel electrode over the second insulating film, the pixel electrode contacting the drain electrode.

14. The display device according to claim 11, wherein the third wiring comprises an oxide, the oxide comprising indium.

15. An electronic device comprising the display device according to claim 11, the electronic device comprising a touch panel adjacent to the display device.

* * * * *

UNITED STATES PATENT AND TRADEMARK OFFICE
CERTIFICATE OF CORRECTION

PATENT NO. : 9,490,268 B2
APPLICATION NO. : 15/075765
DATED : November 8, 2016
INVENTOR(S) : Shunpei Yamazaki et al.

Page 1 of 3

It is certified that error appears in the above-identified patent and that said Letters Patent is hereby corrected as shown below:

In the Specification

At Column 1, Line 28, "formed no" should be --formed so--;

At Column 2, Line 18, "agate" should be --a gate--;

At Column 4, Line 4, "OF INVENTION" should be --OF THE INVENTION--;

At Column 5, Line 48, "$\alpha_2$, in" should be --$\alpha_2$. In--;

At Column 7, Line 4, "wiring. 112c" should be --wiring 112c--;

At Column 8, Line 10, "144b FIGS. 3B" should be --144b in FIGS. 3B--;

At Column 8, Line 19, "mask;" should be --mask,--;

At Column 9, Line 63, "(Hf," should be --(Hf),--;

At Column 10, Line 38, "of -40° C., or" should be --of -40° C. or--;

At Column 13, Line 51, "of for the" should be --of forming the--;

At Column 14, Line 56, "across-sectional" should be --a cross-sectional--;

At Column 14, Line 61, "agate" should be --a gate--;

At Column 14, Line 65, "agate" should be --a gate--;

At Column 16, Line 27, "atop" should be --a top--;

Signed and Sealed this
Sixteenth Day of May, 2017

Michelle K. Lee
*Director of the United States Patent and Trademark Office*

CERTIFICATE OF CORRECTION (continued)
U.S. Pat. No. 9,490,268 B2

Figure 17D:
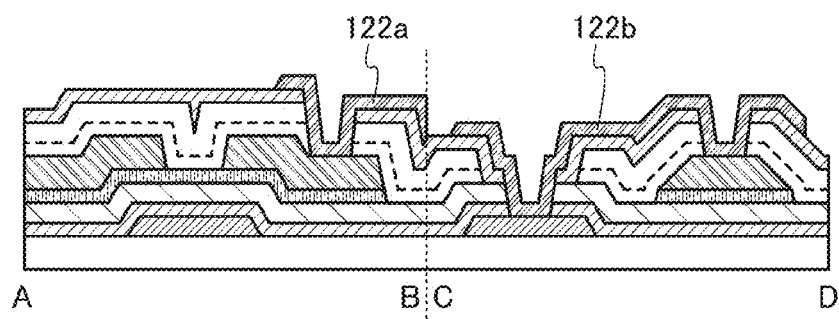

At Column 16, Line 59, "no that" should be --so that--;

At Column 17, Line 23, "see FIG. 16E)." should be --(see FIG. 16E).--;

At Column 17, Line 44, "see FIG. 17D)." should be --(see FIG. 17D).--;

At Column 20, Lines 9-10, "see FIG. 9B)." should be --(see FIG. 9B).--;

At Column 20, Line 42, "111.a" should be --111a--;

At Column 20, Line 47, "semiconductor 111a" should be --semiconductor film 111a--;

At Column 22, Line 56, "$2 \times 10^{16}$ m" should be --$2 \times 10^{16}$--;

At Column 22, Line 65, "no that" should be --so that--;

At Column 23, Line 12, "detect" should be --defect--;

At Column 23, Line 30, "gas especially" should be --gas, especially--;

At Column 23, Line 32, "hand" should be --band--;

At Column 25, Line 67, "then-type" should be --the n-type--;

At Column 27, Line 9, "CAAC-OS is" should be --CAAC-OS film is--;

At Column 27, Line 48, "TEM age," should be --TEM image,--;

At Column 28, Line 61, "night" should be --might--;

At Column 29, Line 21, "aperiodic" should be --a periodic--;

At Column 30, Line 10, "hexagon Here," should be --hexagon. Here,--;

At Column 30, Line 56, "an that" should be --so that--;

At Column 34, Line 59, "sealing substrate)" should be --(sealing substrate)--;

At Column 36, Line 10, "camera," should be --camera),--;

At Column 36, Line 22, "invention. Sample" should be --invention, Sample--;

At Column 36, Line 32, "agate" should be --a gate--;

At Column 37, Line 48, "gas the" should be --gas; the--;

At Column 39, Line 65, "5226," should be --522b,--.